United States Patent [19]

Nakashima et al.

[11] 4,450,579

[45] May 22, 1984

[54] RECOGNITION METHOD AND APPARATUS

[75] Inventors: Masato Nakashima, Yokohama; Tetsuo Koezuka, Tokyo; Takefumi Inagaki, Kawasaki, all of Japan

[73] Assignee: Fujitsu Limited, Kawasaki, Japan

[21] Appl. No.: 272,368

[22] Filed: Jun. 10, 1981

[30] Foreign Application Priority Data

Jun. 10, 1980 [JP] Japan .................................. 55-78235
Dec. 29, 1980 [JP] Japan ................................. 55-187258

[51] Int. Cl.³ .............................................. G06K 9/32
[52] U.S. Cl. ...................................... 382/8; 356/375; 356/399; 358/101; 364/490; 382/25; 382/44; 382/48
[58] Field of Search ................... 382/8, 38, 48, 50, 25, 382/44; 358/101, 107, 106; 364/488–491; 356/373, 375, 399

[56] References Cited

U.S. PATENT DOCUMENTS 3,711,831  1/1973  Kaneko et al. ...................... 382/66
3,898,617  8/1975  Kashioka et al. ..................... 382/8
3,899,634  8/1975  Montone et al. ................... 358/101
4,021,778  5/1977  Ueda et al. ........................... 382/25
4,163,212  7/1979  Buerger et al. ..................... 382/48
4,213,117  7/1980  Kembo et al. ......................... 382/8
4,233,625 11/1980  Altman ................................. 382/8
4,238,780 12/1980  Doemens ............................. 382/8
4,334,241  6/1982  Kashioka et al. ..................... 382/8
4,352,125  9/1982  Guth ................................. 358/101

Primary Examiner—Leo H. Boudreau
Attorney, Agent, or Firm—Staas & Halsey

[57] ABSTRACT

A recognition apparatus comprising an image sensor sensing an image of a pad pattern on an IC chip pattern, a pre-treatment circuit for converting the outputs of the image sensor into binary-coded signals in accordance with at least two slice levels, and a pattern detecting section for detecting the position and inclination of the pad pattern based on the images of the pad and chip patterns corresponding to the data stored in a memory; that is, the binary-coded signals generated in accordance with two slice levels. Two image sensors may be used for sensing the chip and pad data respectively.

23 Claims, 45 Drawing Figures

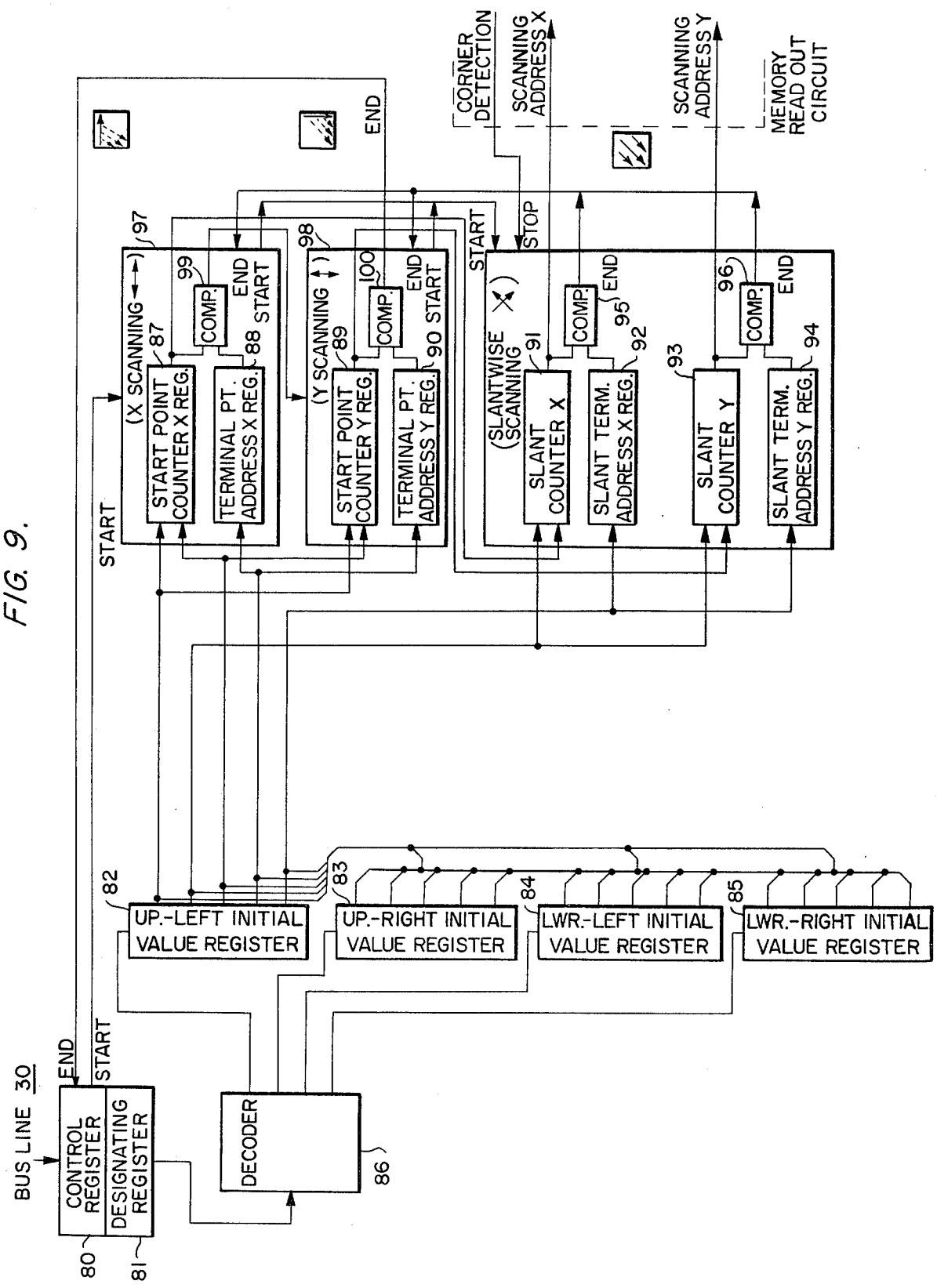

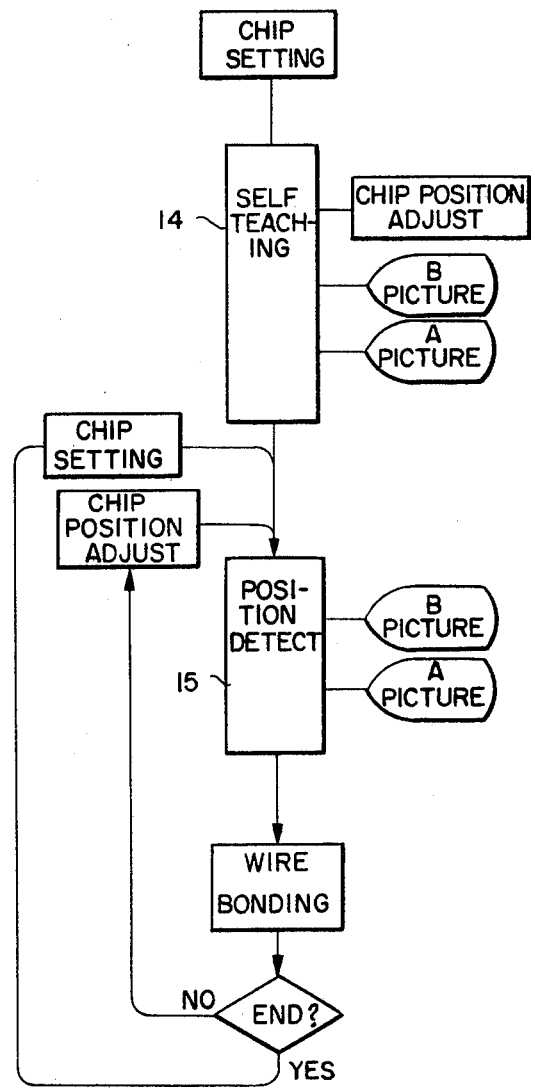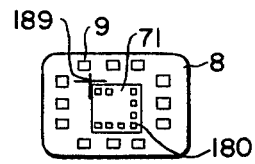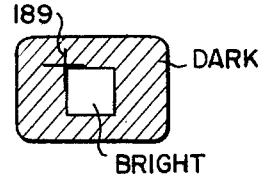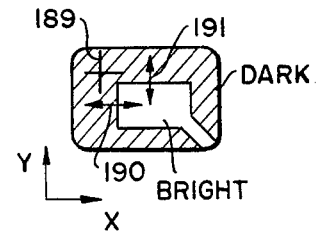

RECOGNITION METHOD AND APPARATUS

BACKGROUND OF THE INVENTION

This invention relates to an apparatus for recognizing a position of a pattern of an object and more particularly to an apparatus which can detect, with a high speed and a high optical S/N (signal to noise) ratio, the position and inclination of an IC chip pattern, and the electrode pad pattern provided on the IC chip, to achieving an efficient automatic wire bonding operation.

To manufacture a hybrid IC or the like, an IC chip pellet is mounted on a substrate, and a wire bonding is connected to the IC chip pellet by an automatic wire bonding apparatus.

To achieve successful automatic wire bonding in assembling semiconductor ICs or hybrid ICs, it is desired that the position of each bonding pad pattern of an IC chip be detected quickly and accurately. Unless the position of the pad pattern is detected quickly and accurately, the yield of products is reduced or the assembling process is delayed. The position of the wire bonding pad pattern is usually detected in the following manner.

First, an image pickup/sensing device such as a TV camera picks up/senses an image of a bonding pad pattern included in the IC chip pattern. Then, from the image of the bonding pad pattern on the IC chip there is obtained data indicating the position and the rotation of the IC pattern. Based on this data the position and inclination of the IC chip and the pads thereon are identified.

Two methods are known, which identify the chip pattern of an IC. One method is to detect a specific electrode pattern on an IC chip as recited in pages 168 to 174, No. 2 volume 19, Japanese Journal of Applied Physics (1980). The other is called multiple local pattern matching method as disclosed in pages 9, to 16, No. 1, volume 96-C, The Transactions of The Institute of Electrical Engineers of Japan (Jan. 1976).

In the first-mentioned method, the surface of an IC pellet is scanned by a single TV camera or the like. Image signals obtained by the scanning are converted into binary-coded signals, based on a desired slice level. Using the binary-coded signals, only the images of pads are displayed. Then, the positional relation or relative positions of a bonding pad existing on a single side of the chip and the other pads existing on the other two sides positioned at both terminals of the aforementioned single side of the chip is detected, thereby determing the position of the bonding pad based on the data of the entire chip.

In the multiple local pattern matching method, the surface of an IC pellet is scanned by a TV camera or the like. Image signals obtained by the scanning are converted into binary-coded signals having a desired slice level. The binary-coded signals representing electrode patterns are compared with the image data representing one of the electrode patterns which is predetermined and whose position is known. When some of the binary-coded signals are found to be identical with said image data, the position of the predetermined electrode pattern is identified and thus the position of a bonding pad is determined with respect to the position of the predetermined electrode pattern.

Both methods need to process image signals obtained by scanning the entire surface of an IC pellet. The amount of data that must be processed is so large that it inevitably takes a long time to identify the chip pattern. Further, the first-mentioned method cannot work if bonding pads are not arranged in orderly rows and columns. The second mentioned method may fail to identify the predetermined electrode pattern correctly, because in most cases some of the electrode patterns on an IC pellet are very similar to the predetermined one and are likely to be matched incorrectly.

Generally speaking, in a conventional method of identifying the pad pattern of an IC chip, the entire IC chip is within the view field, image signals are generated and converted into binary-coded signals having a single desired slice level, and the position of the pad pattern is detected directly from the binary-coded signals. This method, however, is disadvantageous because an enormous amount of data must be processed, and it takes a long time to identify the pad pattern. Further, with this method it is difficult to identify a desired pad pattern when the pad patterns are not arranged orderly, or when wire patterns having a width similar to that of the pad patterns are arranged near the pad patterns.

Further, in the prior art device, the optical signal-to-noise (S/N) ratio is inevitably low. That is, the resolution of the bonding pad pattern image is relatively low. Therefore, this method fails to detect the correct position of the bonding pad pattern when the IC chip is located too far from the image pickup device. Moreover, a wrong position of the bonding pad pattern may be detected if the bonding pads have scratches resulting from a previous electrical test.

SUMMARY OF THE INVENTION

It is an object of the present invention to provide an apparatus which can recognize the position of a pattern on an object with the amount of data required reduced greatly, enabling high speed data processing and avoiding errors in the recognition of the pattern, thus achieving a clear and accurate detection of the object.

Another object of this invention is to provide a recognition apparatus in which an image signal is converted into binary-coded data using a first and second slice level and then stored a memory, thereby detecting the binary-coded data obtained using the second slice level, for example, the position data of a bonding pad pattern based on the binary-coded data obtained using the first slice level is, for example, the shape data of an IC chip, in which, data is detected from only a part of an object to determine the position and shape of the pattern, by providing a view window at a predetermined position of the binary-coded image of the object to be detected and by detecting data through the view window.

Another object of this invention is to provide a recognition apparatus for detecting the position of a pattern on an object, using an image pickup/sensing system having a lens system, a binary-coded signal processing circuit for processing image signals supplied from the image pickup/sensing system and a system for identifying the pattern, said apparatus comprising means for converting the image signals into binary-coded signals having a first slice level, thereby detecting the absolute position and inclination of the object, means for calculating the position of a view window for identifying the pattern, from data representing the absolute position of the object and data representing the positional relation between the object and means for obtaining image signals from the pattern caught in the view window, and converting the image signals into binary-coded signals having a second slice level which differs from the first slice level.

A further object of the present invention is to provide a recognition apparatus for detecting the position of an object, comprising an image pickup section for picking up an image of a pattern on an object, a pre-treatment circuit for converting the outputs of the image pickup section into binary-coded signals, and a pattern detecting section for detecting the position of the pattern from the binary-coded signals produced by the pre-treatment circuit, the image pickup section comprising a first optical system for picking up an image of the object and a second optical system for picking up an image of the pattern.

BRIEF DESCRIPTION OF THE DRAWINGS

In the drawings like parts are marked with like reference numerals.

FIG. 9 is a block diagram of a scanning circuit for detecting a chip corner;

FIG. 22A is a flow chart illustrating the method that the apparatus of the present invention implements to detect a pattern;

FIGS. 22B to 22E illustrates images displayed by monitor television sets;

DESCRIPTION OF THE PREFERRED EMBODIMENTS

Figure 1:
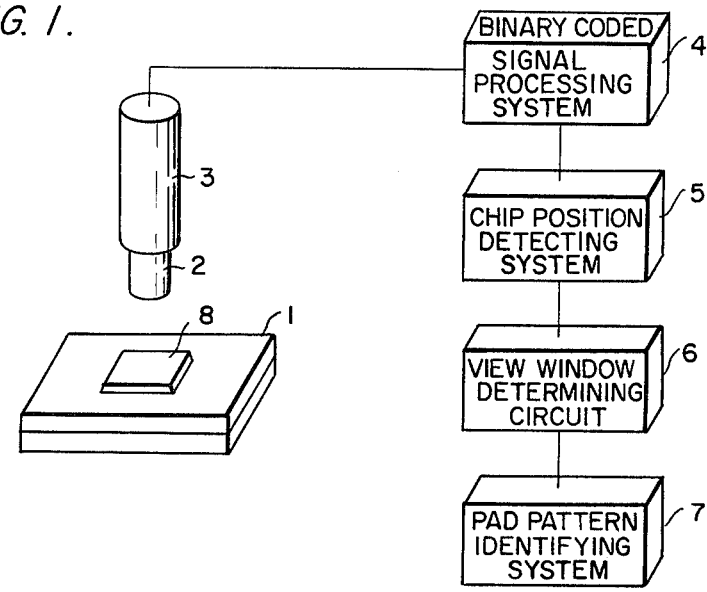
FIG. 1 is a block diagram of an embodiment of the present invention.

As shown in FIG. 1, an embodiment of an apparatus of the present invention for detecting the position of a pad pattern on a semiconductor IC chip comprises an image pickup (or sensing) system 3, a binary-coded signal processing system 4, a chip position detecting system 5, a view window determining circuit 6 and a pad pattern identifying system 7. The image pickup system 3 has a table 1 and a lens system 2.

The image pickup system 3 picks up an image of a semiconductor IC chip 8 located on the stage 1, using the lens system 2, and generates image signals. The image signals are supplied to the binary-coded signal processing system 4. The system 4 converts the image signals into binary-coded signals having a specific slice level and representing the profile of the IC chip 8. At the same time, the system 4 removes noise components from the image signals supplied from the image pickup system 3. The binary-coded signals are supplied to the chip position detecting system 5. The system 5 detects the position of the IC chip 8 according to the binary-coded signals. The binary-coded signals are supplied further to the view window determining circuit 6. The circuit 6 is supplied with view window size data read from a memory (not shown).

Using the binary-coded signals and the view window size data, the circuit 6 determines the position and size of the view window. Then, the image pickup system 3 picks up images of the pad patterns on the IC chip 8 which are within the view window determined by the circuit 6, and generates image signals representing the pad pattern. These image signals are supplied to the binary-coded signal processing system 4. The system 4 then converts the image signals into binary-coded signals based on a specific slice level different from that used in forming the binary-coded signals representing the profile of the IC chip 8. At the same time, the system 4 removes noise components from the image signals. The binary-coded signals thus generated are supplied to the pad pattern identifying system 7. Using the binary-coded signals supplied to it, the system 7 determines the profile and position of the pad pattern.

Figure 2A:
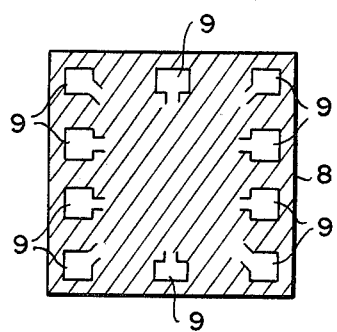
FIG. 2A to 2D illustrate the method of the present invention.
Figure 2B:
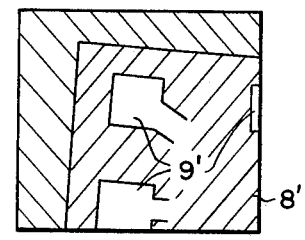
Figure 2C:
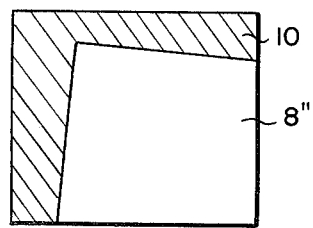
Figure 2D:
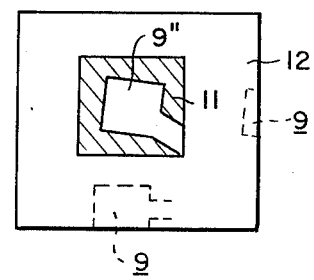

The above-mentioned steps of the present invention may be better understood from FIGS. 2A to 2D which illustrate the images sensed in above steps. FIG. 2A is an image of the IC chip 8, showing pad patterns 9, FIG. 2B is an image, picked up by the image pick-up system 3, showing the IC chip 8' and the pad patterns 9'. FIG. 2C is an image of the IC chip 8", obtained by the binary-coded signal processing system 4. In FIG. 2C, the blank portion corresponds to the IC chip 8 and the hatched portion represents the area outside the IC chip 8. FIG. 2D is an image of a pad pattern 9", obtained by processing the image signals representing the pad pattern 9 into binary-coded signals having a slice level different from that of the binary-coded signals representing the profile of the IC chip 8. In FIG. 2D, the square 11 represents the view window determined by the circuit 6, the square 12 represents a surface portion of the IC chip 8 which is located outside the view window 11 and is not identified and a pad pattern 9" is positioned in the identifying square 11.

Figure 3A:
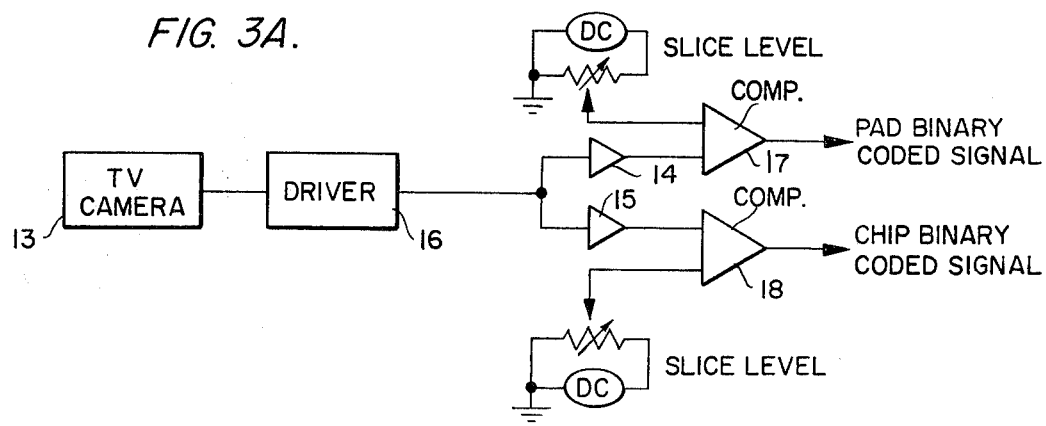
FIG. 3A is a block diagram of a circuit for obtaining binary-coded signals having two slice levels which are used in the invention.

FIG. 3A is a circuit diagram of a circuit for forming binary-coded signals based on a first and second slice level. An image signal picked up by a TV camera 13 is applied to two buffer amplifiers 14 and 15 through a T.V. driver 16. The outputs of two buffer amplifiers are applied to the two comparators 17 and 18 having different slice levels. The buffered signals are then converted into binary-coded signals having different slice levels by the comparators 17 and 18.

Figure 3B:
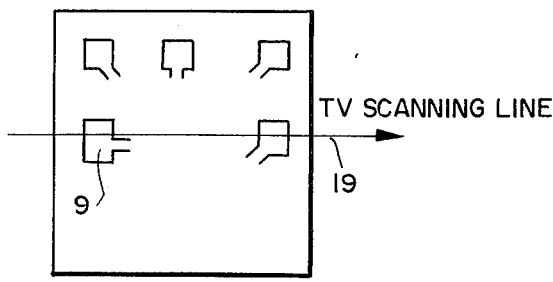
FIGS. 3B to 3D illustrate how the two binary coded signals are obtained.
Figure 3C:
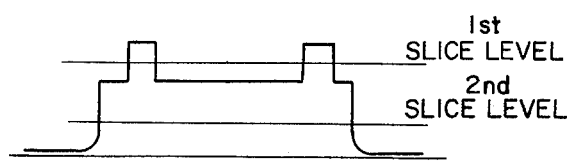
Figure 3D:
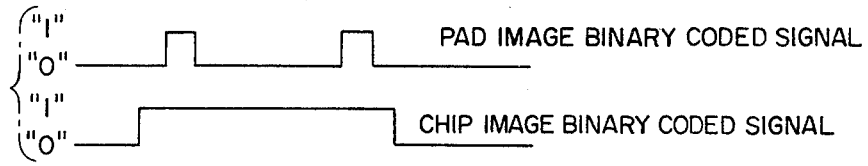

FIG. 3B shows an image of a chip 8 and pad 9. FIG. 3C shows an image signal of the scanning lines 19 (FIG. 3B) of the T.V. camera 13 for a chip 8 and pad 9. When the image signal is converted into a binary-coded signal using the two slice levels shown in FIG. 3C, then chip image and pad image binary-coded signals are obtained, as shown in FIG. 3D.

Figure 4:
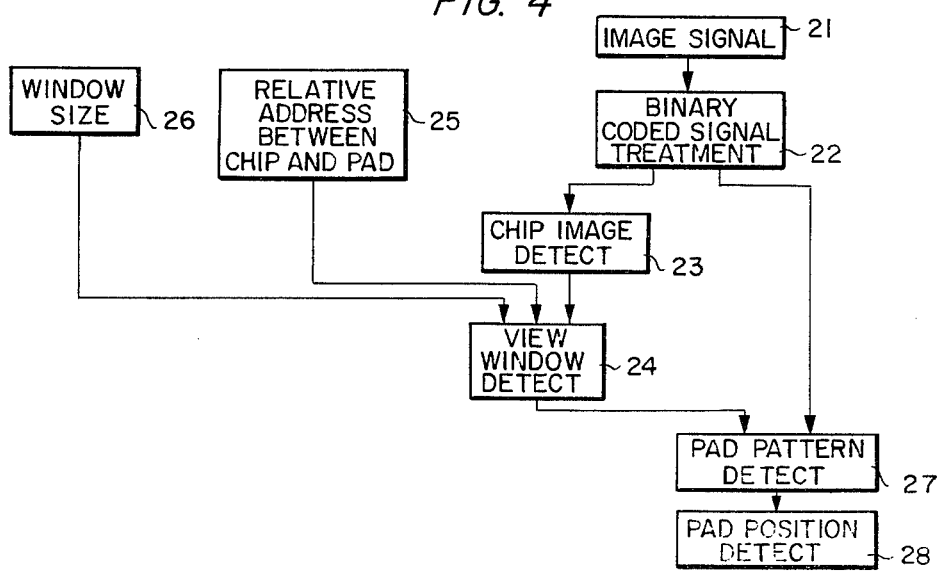
FIG. 4 is a flow chart illustrating the process of the present invention for detecting the position of the pattern.

With reference to the flow chart shown in FIG. 4, the process of the present invention for detecting the position of a pattern is described.

In step 22, the image signals 21 generated by the image pickup system 3 are converted into binary-coded signals having a desired slice level. In step 23, the image of the IC chip 8 is detected. In step 24, the chip image data showing the position and inclination of the IC chip 8, data 25 representing the positional relation between the IC chip 8 and the pad pattern 9 and data 26 representing the size of a view window are used to determine the position of the view window. Both data 25 and 26 are stored in a memory (not shown). In step 27, the binary-coded signals, representing a pad pattern 9 within the view window having a slice level different from that of the binary-coded signals representing the profile of the IC chip 8, are used to obtain the image of the pad pattern 9. Finally in step 28, the position of the pad pattern 9 is detected from the image obtained in step 27.

Figure 5:
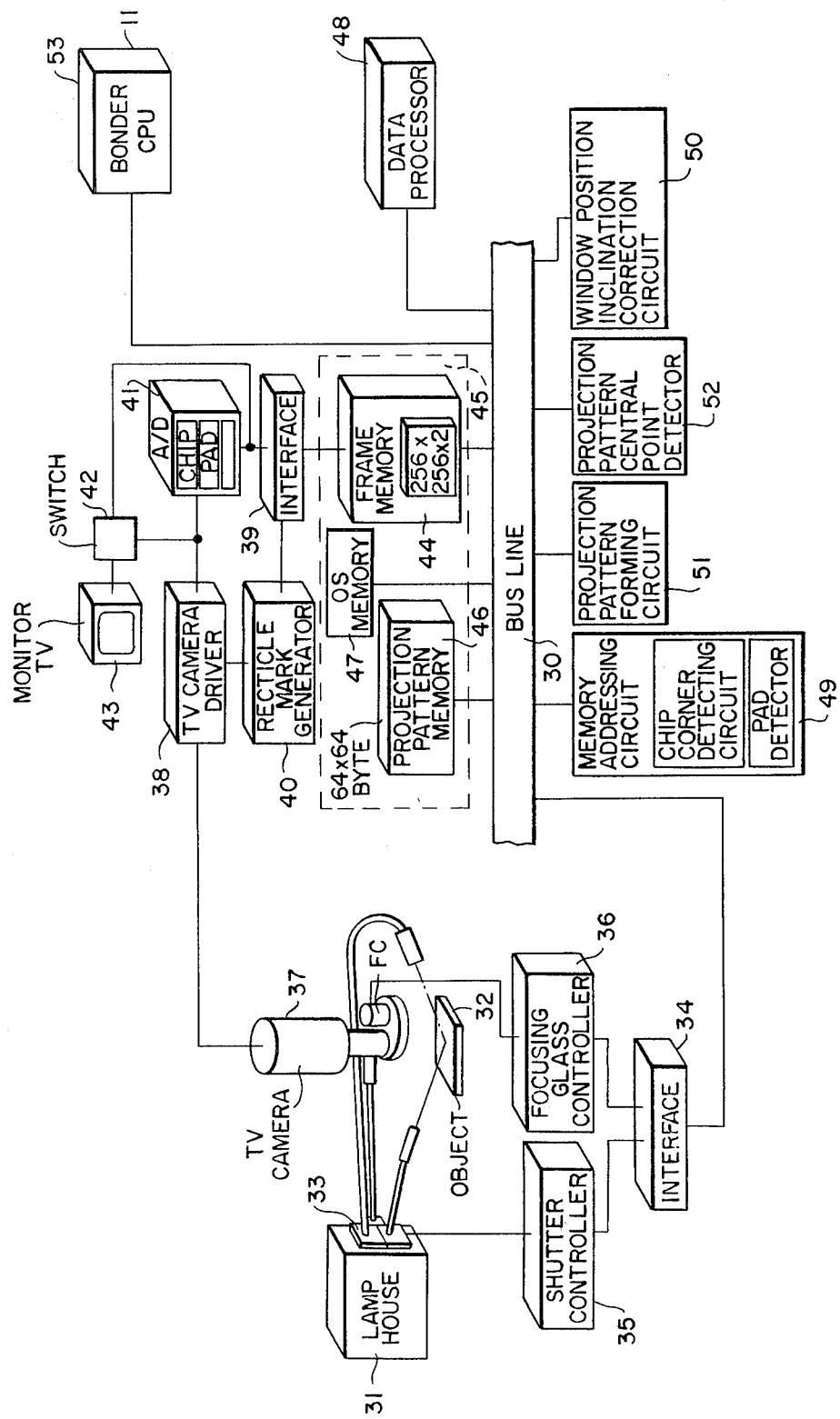
FIG. 5 is a block diagram illustrating the system of the present invention.

FIG. 5 is a block diagram of the first embodiment of the invention. A lamp house 31 is a light source for emitting light to illuminate an object 32, i.e. a semiconductor IC chip. At its output side 33, a shutter is provided. The shutter is opened and closed by a shutter controller 35, which is controlled by an interface 34. The interface 34 is connected to a bus line 30 and controlled by signals supplied via the bus line 30. The interface 34 is connected also to a focusing glass controller 36. Under the control of the interface 34 the controller 36 moves a focusing glass in front of a TV camera 37 back and forth, thereby adjusting the position of the focal point of the TV camera 37. The shutter controller 35 and the focusing glass controller 36 are signal adaptors which receive control signals from the interface 34 and which move the shutter and the focusing glass, respectively, according to the control signals.

The lamp house 31 shines light onto the object 32. The TV camera 37 receives the light reflected from the object 32 and converts the light into electric image signals. The image signals are supplied to a TV camera driver 38. Connected to the TV camera driver 38 which is connected to reticle mark generating circuit 40. The circuit 40 is connected to receive signals supplied from an interface 39 and generates a reticle mark signal. The reticle mark signal is supplied to the TV camera driver 38. Upon receipt of the reticle mark signal, the TV camera driver 38 generates an output signal, which is supplied to an analog-digital converter 41. At the same time, the TV camera driver 38 transfers the image signals via a switching circuit 42 to a monitor TV set 43. The switching circuit 42 supplies the image signals or the binary coded signals to the monitor TV set 43, in accordance with the signal supplied from the interface 39.

The analog-digital converter 41 converts the image signals into digital signals, some for forming an image of the object 32, i.e. a semiconductor IC chip, and the others for forming an image of a pad pattern on the IC chip. All the digital signals are one-bit signals. But the digital signals for forming an image of the IC chip have one slice level, and the digital signals for forming an image of a pad pattern have another slice level. More precisely, the signals for forming an image of the IC chip have a slice level such that the resultant image is clearly distinguishable from the image of an XY stage on which the IC chip is placed. The signals for forming an image of a pad pattern have a slice level such that the resulting pad image is well distinguished from the IC chip image.

All the digital signals produced by the analog-digital converter 41 are stored in a frame memory 44 through the interface 39. An image formed by the digital signals, whether an IC chip image or a pad image, comprises 256 (X-axis)×256 (Y-axis) bits. The frame memory 44 has a memory capacity corresponding to two images, i.e. an IC chip image and a pad image. That is, its memory capacity is: $(256 \times 256) \times 2 = 131,072$ bits.

Besides the frame memory 44, there are provided a projection pattern memory 46 and an OS memory 47. The memories 44, 46 and 47 comprise the memory section 45. The projection pattern memory 46 is a 64×64 byte memory and the OS memory 47 is a 4K-byte memory storing operating software. To store the digital signals defining both the IC chip image and the pad image to the frame memory 44, a data processor 48, connected to the bus line 30, processes the necessary data. A chip corner is detected by a chip corner detecting circuit 49 using image data, representing a chip, stored in the frame memory 44. Data of a window position is detected by using the detection data of the chip corner and data indicating the inclination of the window position, and is corrected by a circuit 50 for correcting the inclination of the window position. Thereafter, a projection pattern forming circuit 51 detects a projection pattern within the view window, namely, a projection pattern of a pad, using position and inclination data stored in the frame memory the data corresponding to the area within the view window. The circuit 52 detects the central point of the projection pattern, namely, a center of the pad. The data indicating the center of the pad as detected above is used in wire-bonding a bond to the pad. A wire is bonded to a pad using the above-recited result under the control of a bonder CPU 53.

Figure 6:
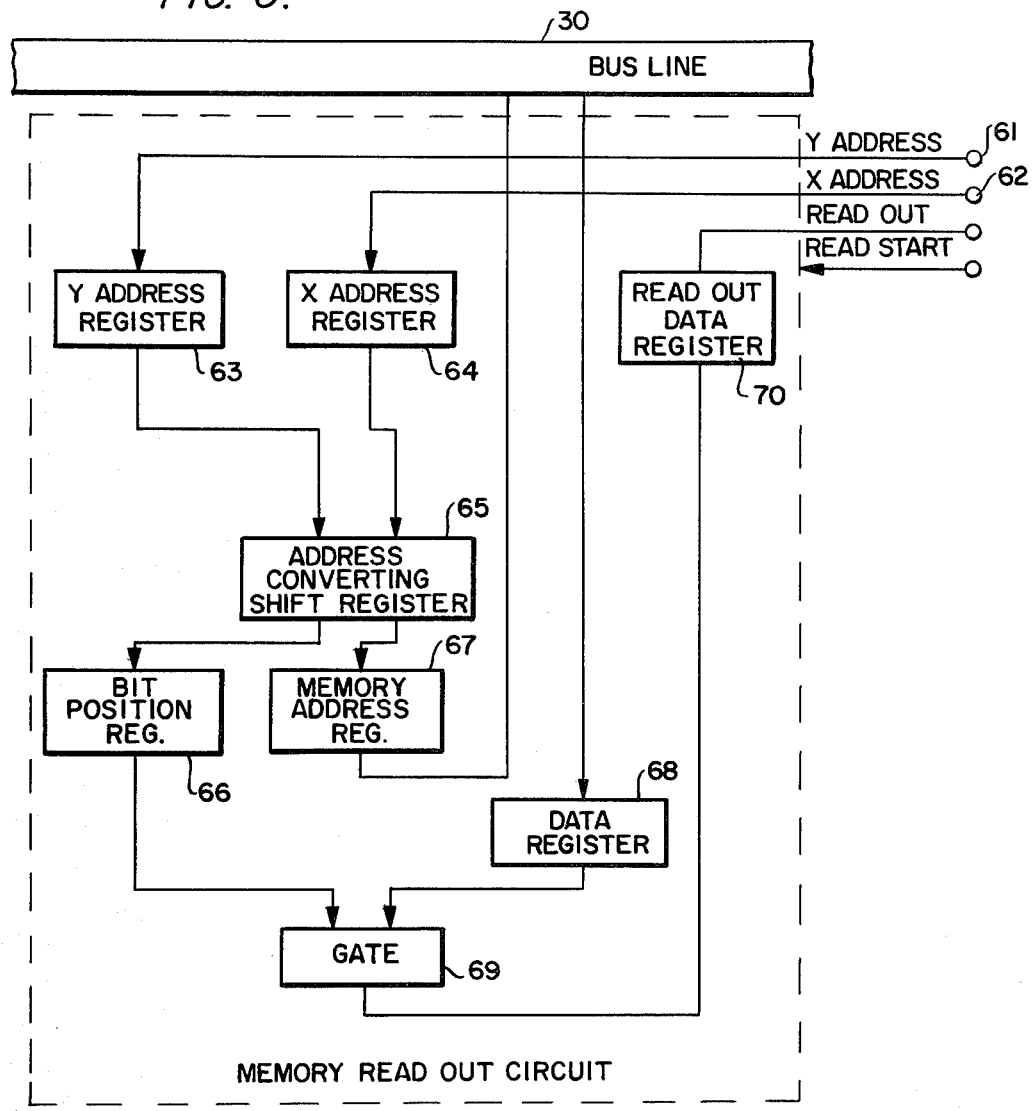
FIG. 6 is a block diagram of a memory read circuit.

FIG. 6 illustrates a memory reading circuit for the embodiment shown in FIG. 5. The data stored in the frame memory 44 is one-byte data, each byte comprising eight picture elements. The memory reading circuit is designed to provide data in single bit form, from data stored in the frame memory 44 which stores data in byte form. The circuit has a Y address input terminal 61 and an X address input terminal 62. When both address input terminals 61 and 62 receive address data, the address data is stored in a Y address register 63 and a X address register 64, respectively. The address data is then transferred to an address converting shift register 65. The Y address data is stored in the upper memory location of the shift register 65, whereas the X address data is stored in the lower memory location of the shift register 65. The contents of the shift register 65 is shifted by 3 bits at a time. Each three bits shifted from the shift register 65 are written into a bit position register 66. The remaining 13 bits are written into a memory address register 67 together with a 3-bit upper location address data allotted to the frame memory address.

The memory address register 67 designates one of the addresses of the frame memory 44 through the bus line 30. If one address of the frame memory 44 is designated, one byte of data is read out of the addressed location and applied to the data register 68. The 8-bit data is applied to gate circuit 69 together with 3-bit data from the bit position register 66. The gate circuit 69 delivers one of the eight bits designated by the 3-bit data supplied from the bit position register 66 and supplies this one-bit signal to a read-out data register 70. The register 70 therefore stores the one bit of data designated by the Y address data and X address data supplied through the address input terminals 61 and 62, respectively. Upon receipt of the READ START signal the one-bit data is outputted from the register 70.

Figure 7:
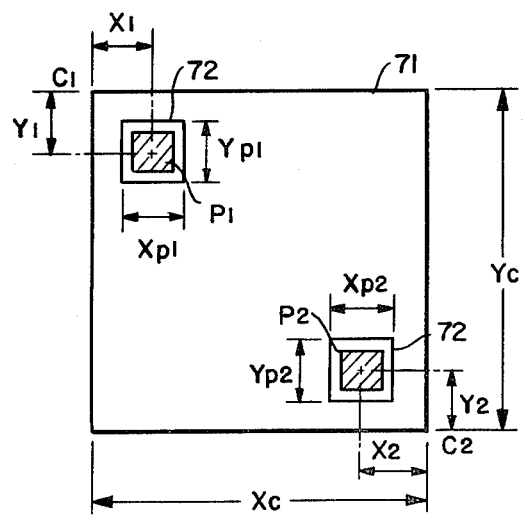
FIG. 7 illustrates the relative position of a pad data and a view window.

FIG. 7 shows the positional relation between an IC chip and pad patterns and the size of a view window. Data showing the positional relation and the view window size may be written into the memory (not shown) by the known manual input means called "self-teaching I/O device." This data indicates, for example, the distance $x_1$ between a corner $C_1$ of an IC chip image 71 and a vertical line passing the center of a pad pattern $P_1$, the distance $y_1$ between the corner $C_1$ and a horizontal line passing the center of the pad pattern $P_1$, the distance $x_2$ between another corner $C_2$ of the chip image and a vertical line passing the center of a pad pattern $P_2$, and the distance $y_2$ between the corner $C_2$ and a horizontal line passing the center of the pad pattern $P_2$. The centers of the pad patterns $P_1$ and $P_2$ correspond to the center of each view window 72. The other data show the lengths $x_{P1}$, $y_{P1}$, $x_{P2}$ and $y_{P2}$ of the four sides of the view window 72 and the lengths $x_C$ and $y_C$ of two adjacent sides of the rectangular IC chip image 71. The size of the view window 72 must be large enough to view one pad pattern $P_1$ or $P_2$, even if the pad pattern inclines about 10° in either direction.

Figure 8A:
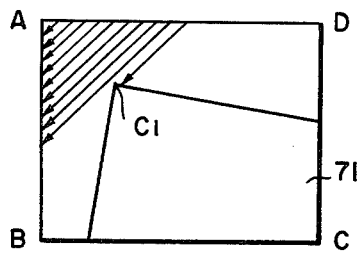
FIGS. 8A and 8B illustrate the detection of a chip image according to the present invention.
Figure 8B:
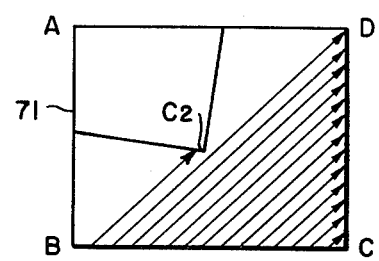

With reference to FIGS. 8A and 8B, detection of the IC chip image 71 in accordance with the present invention, is described. More specifically, FIG. 8A illustrates the detection of the upper-left corner $C_1$ of the IC chip 71, and FIG. 8b shows the detection of the lower-right corner $C_2$ of the IC chip image 71. As shown in FIG. 8A, an image area ABCD is scanned in slantwise direction as shown by arrows, beginning at the upper-left corner A of the area ABCD. This scanning is performed according to data written into the memory by a self-teaching I/O device (not shown) and is continued until the upper-left corner $C_1$ of the IC chip 71 is scanned. Thus, the first signal obtained by the scanning represents the upper-left corner $C_1$ of the IC chip 71. Then, as shown in FIG. 8B, another image area ABCD is scanned in slantwise direction as shown by arrows, beginning at the lower-right corner C of the area ABCD. This scanning is performed until the lower-right corner $C_2$ of the IC chip 71 is scanned. Thus, the first signal obtained by this scanning represents the lower-right corner $C_2$ of the IC chip 71. Once both corners $C_1$ and $C_2$ have been detected, the position of the IC chip 71 is known.

FIG. 9 shows a chip corner detecting scanner circuit. Bus line 30 supplies a signal representing one of four scanning directions. That is, one of the signals indicating scanning toward the upper-left corner, toward the upper-right corner, toward the lower-left corner and toward the lower-right corner, is supplied to the scanning direction designating register 81. The register 81 is connected to a decoder 86. Through this decoder 86 the register 81 selects, according to the signal, one of four initial value registers, i.e. an upper-left initial value register 82, an upper-right initial value register 83, a lower-left initial value register 84 and a lower-right initial value register 85. The initial value of the register selected is stored to a start point counter X register 87, a terminal point address 88, a start point counter Y register 89, a terminal point address Y register 90, a slant counter X register 91, a slant terminal end address X register 92, a slant counter Y register 93 and a slant terminal address Y register 94. The data designating count-up or count-down is supplied to the start point counter X register 87 and a start point counter Y register 89. Data designating count-up or count-down is supplied to the slant counter X register 91 and the slant counter Y register 93.

When a start signal is stored via the bus line 30 to the control register 80, the register 80 supplies a scanning start signal to the registers 87, 91 and 93. Upon receipt of the scanning start signal, the slant counter X register 91 and the slant counter Y register 93 start to increment or decrement. Comparator 95 compares the counts of the registers 91 and 92, and a comparator 96 compares the counts of the registers 93 and 94. When the counts of the registers 91 and 92 become equal, the comparator 95 supplies the X scanning register group 97 and the Y scanning register group 98 with a signal indicating that slantwise scanning has been completed. Similarly, when the counts of the registers 93 and 94 become equal, the comparator 96 supplies the X scanning register group 97 and the Y scanning register group 98 with a signal indicating that slantwise scanning has been completed.

Upon receipt of the signal from the comparator 96, the start point counter X register 87 is incremented or decremented and then applies its contents to the slant counter X register 91. The contents of the start point counter Y register 89 remains unchanged and is applied to the slant counter Y register 93. Supplied with new data, both registers 91 and 93 again start slantwise scanning. They repeat slantwise scanning until the contents of the start point counter X register 87 is identical to the contents of the terminal point address X register 88. Whether or not the contents of the registers 87 and 88 are identical is detected by comparator 99. When the contents of the registers 87 and 88 are identical, the comparator 99 supplies a START signal to the Y scanning register group 98, keeping the contents of the register 87 unchanged.

Now, the start point in the X-axis direction is fixed, and the contents of the start point counter Y register 89 is incremented or decremented every time slantwise scanning is conducted. This slantwise scanning is repeated until the contents of the start point counter Y register 89 is identical to the contents of the terminal point address Y register 90. Whether or not the contents of the registers 89 and 90 is detected by a comparator 100. When the comparator 100 detects that the contents of the registers are equal, it supplies an END signal indicating that the slantwise scanning has been completed.

However, the slantwise scanning is interrupted if a corner detection signal is supplied from a memory access circuit. That is, a corner detection signal stops the slantwise scanning. In practice, corner detection signals are supplied during the slantwise scanning, and the slantwise scanning is rarely completed.

In the chip corner detecting scanner circuit shown in FIG. 9, X addresses are the contents of the slant counter X register 91, and Y addresses are the contents of the slant counter Y register 93. The contents of the registers 91 and 93 are supplied as scanning addresses X and Y to a memory reading circuit during the slantwise scanning.

Figure 10:
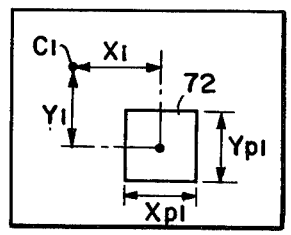
FIGS. 10, 11 and 12 illustrate the process of determining position and size of a view window according to the present invention.
Figure 11:
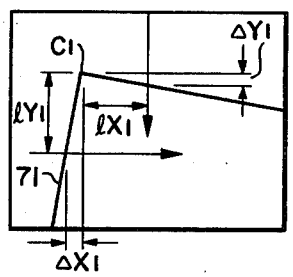
Figure 12:
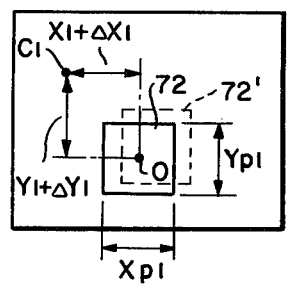

Now, with reference to FIGS. 10, 11 and 12, the process of determining the size and position of a view window is discussed. First, as illustrated in FIG. 10, the size and position of a view window 72 are determined by the data representing the distances $x_1$ and $y_1$ and the data showing the lengths $x_{p1}$ and $y_{p1}$—all this data read from the memory. Then, the IC chip image 71 is scanned along a vertical line passing a point at a horizontal distance $lx_1$ from the upper-left corner $C_1$ of the chip image 71, thereby detecting a displacement $\Delta y_1$ which depends on the inclination of IC chip image 71. Further, the IC chip image 71 is scanned along a horizontal line passing a point at a vertical distance $ly_1$ from the upper-left corner $C_1$, thereby detecting a displacement $\Delta x_1$ which depends on the inclination of IC chip image 71. Next, using the displacements $\Delta x_1$ and $\Delta y_1$, the position of the view window 72 is corrected, as illustrated in FIG. 12. That is, the view window 72, initially placed at a position indicated by the dotted lines in FIG. 12, is so moved that its center 0 is positioned at a horizontal distance $x_1+\Delta x_1$ from the upper-left corner $C_1$ of the IC chip image 71 and at a vertical distance $y_1+\Delta y_1$ from the upper-left corner $C_1$. The size of the view window 72 remains unchanged, and its adjacent two sides have lengths $x_{p1}$ and $y_{p1}$.

The view window 72 is not inclined no matter how much the IC chip image 71 is inclined. Further, a pad pattern is fully within the view window 72, because as mentioned above, the size of the view window 72 is large enough to view one pad pattern even if the pad pattern is inclined at about 15° in either direction.

To position the view window 72 such position that a pad pattern near another corner of the IC image 71 is within the view window 72, the corner is first detected, as above, when the position and size of the view window 72 are determined by data read out of the memory, using the corner of the IC chip image 71 as a reference point.

Figure 13:
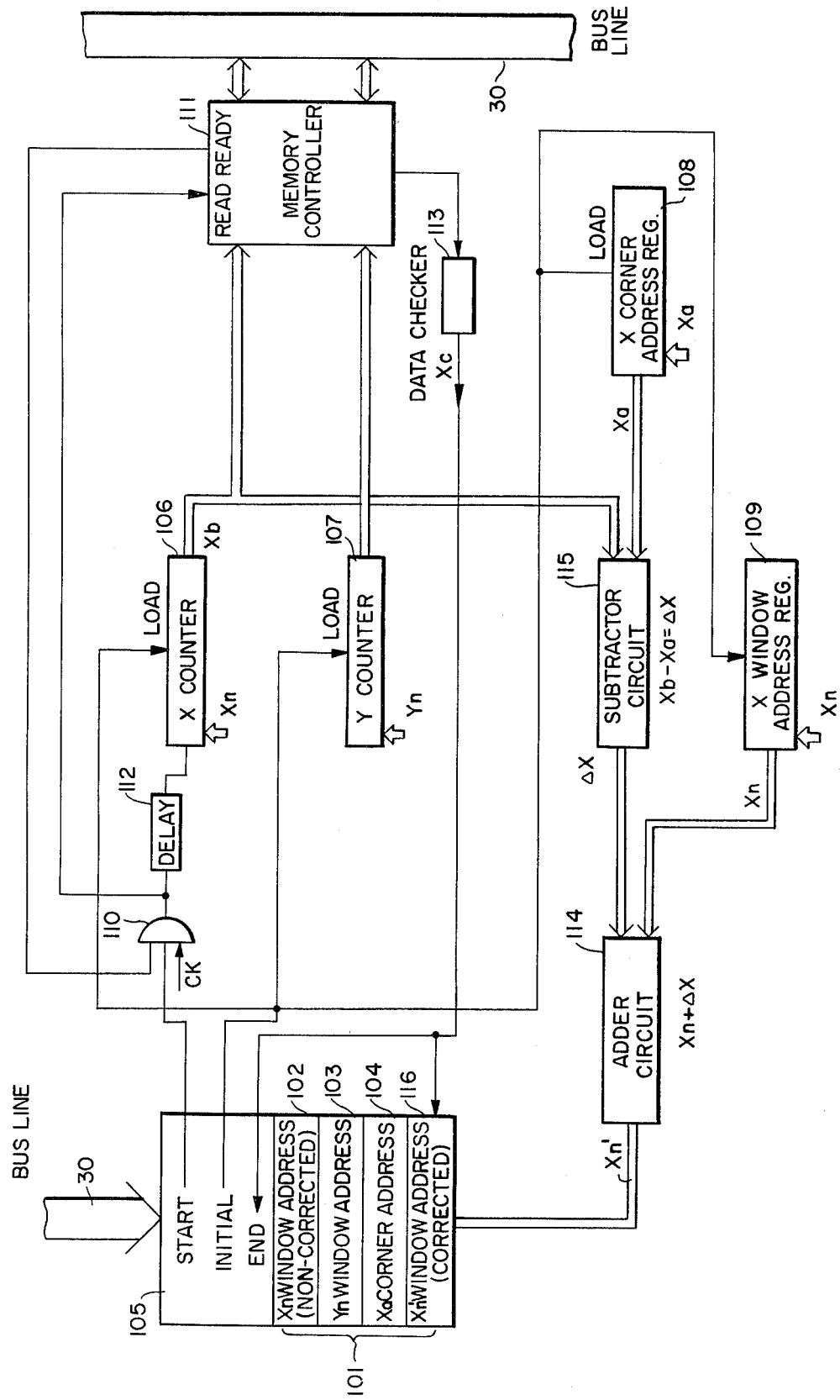
FIG. 13 is a block diagram of a circuit for correcting the inclination of the position of the view window.

FIG. 13 shows a circuit for correcting the inclination of the view window 72 in X direction, which is used in the circuit illustrated in FIG. 5. The correcting circuit comprises a data register unit 101 comprising an X window address (non-corrected) register 102, a Y window address (non-corrected) register 103, an X corner address register 104 and an X window address (corrected) register 116. Data is supplied from the bus line 30 to the registers 102, 103, 104 and 105. Then, a control register 105 is initially set by an instruction supplied from the bus line 30. As a result, the contents Xn of the register 102 is transferred to an X counter 106 and an X window address register 109, the contents Yn of the register 103 is transferred to an Y counter 107, and the contents Xa of the register 104 is transferred to an X corner address register 108.

Thereafter, a start instruction is supplied, from the bus line 30, to the control register 105, the register 105 supplies a START signal to one input terminal of an AND gate 110. The other input terminal of the AND gate 110 is connected to a READY terminal of a memory controller 111. The memory controller 111 is in an initial start or in an "on" state and thus generates a "1" READY signal. The "1" signal is supplied to the AND gate 110, whereby the AND gate 110 generates a clock signal. The clock signal is supplied via a delay circuit 112 to the X counter 106, thus incrementing the contents of the X counter 106. It is also supplied to a READ terminal of the memory controller 111. Upon receipt of the clock signal the memory controller 111 receives the contents of the X counter 106 and of the Y counter 107. Further the memory controller 111 reads from the frame memory 44 a bit data from the address designated by the contents of the X counter 106 and the contents of the Y counter 107. The bit data is supplied to a data checker 113, which detects whether the bit data is a "1" signal or a "0" signal. When the bit data is a "0" signal, the data checker 113 generates an output signal Xc. The signal Xc is supplied to the X window address (corrected) register 116 and to the control register 105 as an END signal. When the bit data is a "1" signal, the data checker 113 generates no signal. That is, the AND gate 110 supplies clock signals one after another, and the sequence of operations mentioned here is repeated until the data checker receives a "0" signal.

The correcting circuit further comprises a subtractor circuit 115 which subtracts the contents Xa of the X corner address register 104 from the contents Xb of the X counter 106, thus obtaining the difference $\Delta x$ ($=Xb-Xa$). The data indicating the difference $\Delta x$ is supplied to an adder circuit 114, which adds the difference $\Delta x$ to the contents Xn of an X window address register 109. The sum $X_{n1}$ ($=Xn+\Delta x$) is supplied to the X window address (corrected) register 116. The data indicating the sum Xml, however, is not written into the register 116 until the signal Xc is supplied to the register 116 from the data checker 113. That is, the data indicating the sum $X_{n1}$ is written into the register 116 when the data checker 113 receives "0". Similar processing is carried out in Y direction.

Figure 14A:
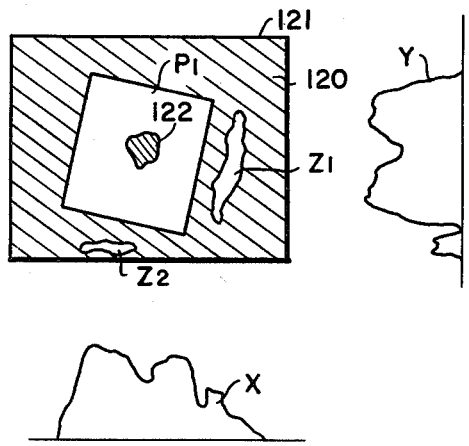
FIGS. 14A and 14B indicate how a pad pattern is identified according to the present invention.
Figure 14B:
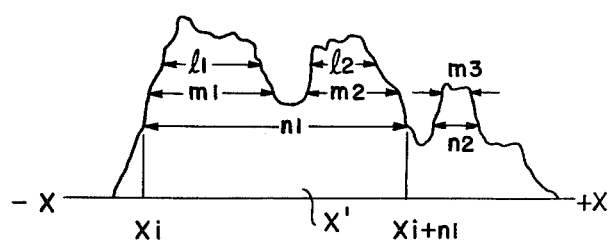

Now, is described how the position and size of a pad pattern image within the view window 72 is determined, with reference to FIGS. 14A and 14B.

As shown in FIG. 14A, a pad pattern image $P_1$ obtained by converting image signals representing a pad pattern into binary-coded signals is projected onto the x axis and the y axis, thus obtaining an x-axis projection pattern X and a y-axis projecting pattern Y. In FIG. 14A, numeral 122 is a production probing (P-P) scar, $Z_1$ and $Z_2$ are patterns which need not be identified, numeral 120 is a non-signal region, and numeral 121 is a view window. The width and center of the x-axis projection pattern X and the width and center of the y-axis projection pattern Y are determined in the following manner, thereby determining the position and size of the pad pattern image $P_1$.

FIG. 14B illustrates the process of determining the width and center of the x-axis projection pattern X'. First, the length of two parts of a row, extending parallel to the x-axis and through the upper portion of the projection pattern X', are counted, thus detecting lengths $l_1$ and $l_2$ of the rows. If neither part of these length are found to be longer than a pre-determined pad pattern width $l_0$ stored in the memory, the lengths of three parts of a row, extending through that portion of the pattern X' lying below the first length are counted, thus detecting lengths m1, m2 and m3 of these parts. The lengths m1, m2 and m3 are compared with the predetermined pad pattern width $l_0$. If none of the lengths m1, m2 and m3 are longer than the width $l_0$, the bits of the row lying below the three lengths are counted. Similar operations are repeated until a row of bits is found to be longer than the width $l_0$. For example, when a row having a length $n_1$ is found to be longer the width $l_0$, the length $n_1$ is regarded as the width of the x-axis projection pattern X'. The address $x_i$ of one end of the row is detected, and so is the address $x_i+n_1$ of the other end of the row. The address, $(x_i+x_i+n_1)/2$, of the middle point of the row is regarded as the address of center of the x-axis projection pattern X'.

The width and center of the y-axis projection pattern Y are determined in the same way as those of the x-axis projection pattern X'. According to the addresses of centers of both x-axis and y-axis projection patterns, the address of the center of the pad pattern $P_1$ is determined.

Alternatively, to determine the address of the center of the pad pattern $P_1$, first the bits of a row extending through the lowest portion of the pattern X', and then the bits of a row or rows extending above this row are counted, until any row of bits is found to be shorter than the predetermined pad pattern width $l_0$. Then, the number of the bits of the row right under the row shorter than $l_0$, is regarded as the width of the pad pattern. This method has the same effect as the above-mentioned method.

The above mentioned method of determining the address of center of the pad pattern $P_1$ is advantageous, whether the bits of the uppermost row or the bits of the lowest row are counted first, in some aspects. First, the correct width of the pad pattern $P_1$ is detected even if the pad has a P-P scar. Secondly, patterns which need not be identified, such as wire patterns, are not detected.

Figure 15:
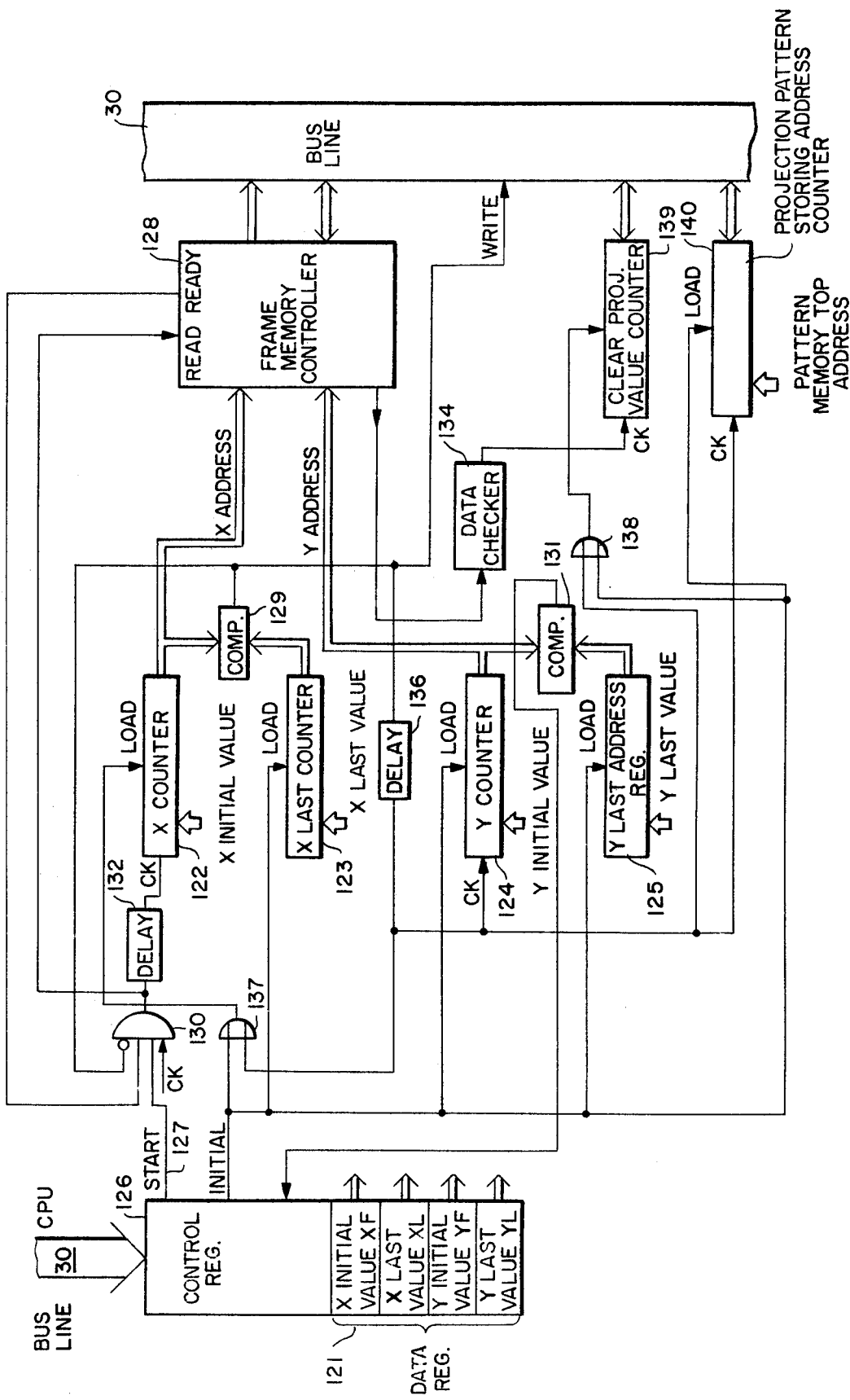
FIG. 15 is a block diagram of a circuit for forming a projected pattern.

FIG. 15 shows a projection pattern forming circuit of the embodiment shown in FIG. 5. An initial X value XF, a last X value XL, a initial Y value YF and a last Y value YL supplied via the bus line 30 and are written into the data register 121. These values XF, XL, YF and YL are written respectively into an X counter 122, an X last address register 123, a Y counter 124 and a Y last address register 125 when an initial instruction is applied to the control register 126. Further provided is a projection pattern storage address counter 140, into which the first address of the projection pattern memory 46 is written.

When an initial instruction is applied to the control register 126, the data register 121 supplies a start signal via its start signal output terminal 127. Further, if the initial stage operation or last stage has been completed, a READY signal from the frame memory controller 128 is "1" level and the output of a comparator 129 is "0" level. In this case, AND gate 130 generates a clock signal when it receives the start signal from the data register 121. The output of the AND gate 130, i.e. the clock signal, is supplied through a delay circuit 132 to the X counter 122 and thus increments the count of the X counter 122. At the same time, the output of the AND gate 130 is supplied to the READ terminal of the frame memory controller 128 in response to which X address data and Y address data are written into the frame memory controller 128.

When the clock signal is supplied applied to the READ terminal of the frame memory controller 128, controller 128 starts storing the data from the X counter 122 and the Y counter 124. The controller 128 supplies the data checker 134 with 2-bit dot data, which is stored in an area frame memory 44 and correponds to the data from the X counter 122 and the Y counter 124, i.e. the X address data and Y address data of the frame memory 44. When the data checker 134 receives a "1" data from the controller 128, it increments the count of a projection value counter 139. This sequence of operations is repeated until the data stored in the X counter 122 is identical to the data stored in the X last address register 123. That is, the operation is repeated until the data checker 134 finishes checking all of the 2-bit dot data comprising one row of the frame memory 44.

When the data stored in the X counter 122 and the X last address register 123 are identical, the comparator 129 generates a "1" signal. This "1" signakl is supplied to the AND gate 130 and blocks the clock signal. Thus, the count of the projection value counter 139 is stored in the projection pattern memory 46. The output of the comparator 129 is supplied via a delay circuit 136 to the Y counter 124 and a projection pattern storage address counter 140. Hence, the output of the comparator 129 increments both the Y counter 124 and the counter 140. Further, the first X value XF is loaded via the delay circuit 136 and OR gate 137 in response to the output of the comparator 129. Still further, the output of the comparator 129 is supplied through OR gate 138 to the projection value 139 and clears the count of the counter 139.

When the count of the X counter 122 equals to the first X value XF in the above-mentioned manner, the output of the comparator 129 is again a logic level "0", thus enabling AND gate 130. Once the AND gate 130 is enabled, the number of bits comprising a row are counted until the count of the Y counter 124 equals to the data stored in the Y last address register 125. When the count of the Y counter 124 equals to the data stored in the Y last address register 125, the comparator 131 generates an output of "1" level. The output of the comparator 131 is supplied to an END terminal of the control register 126, indicating that a projection pattern has been formed completely. Then, data representing a pad image projected in Y-axis direction is stored in the projection pattern memory 46 through the bus 30.

Figure 16:
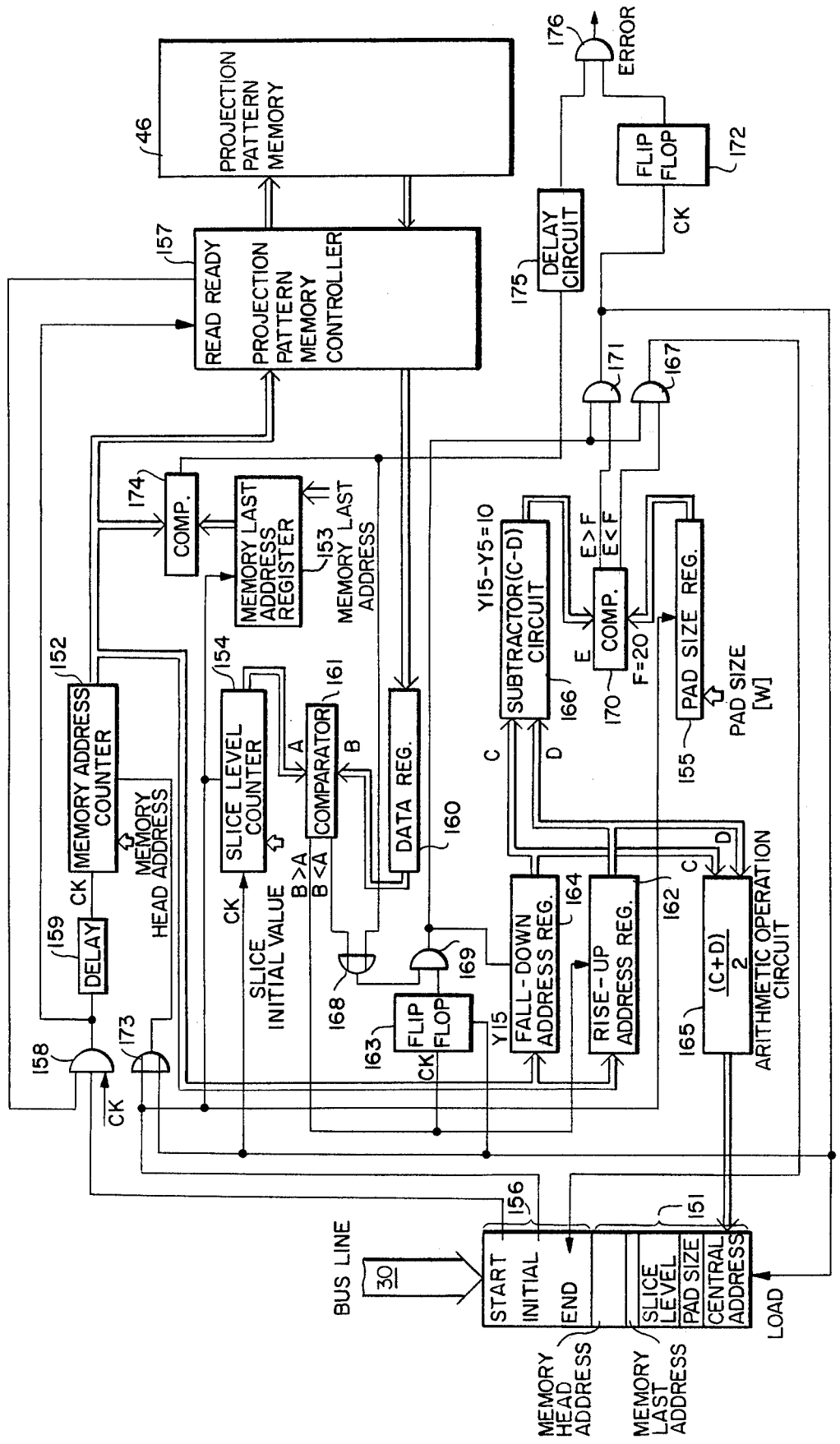
FIG. 16 is a block diagram of a circuit for detecting a central point of the project pattern.

FIG. 16 illustrates a circuit for detecting the middle point of a projection pattern, which is used in the embodiment shown in FIG. 5. The data register 151 is connected to the bus line 30 to receive a memory heading address initial data, a memory last address data, a slice level initial data and a pad size data. This data is loaded, according to initial set instructions supplied from the CPU, into a memory address counter 152, a memory last address register 153, a slice level counter 154 and a pad size register 155, respectively. When a start instruction is supplied from the CPU to register 156, the register 156 generates a start signal which is applied to AND gate 158.

A READY signal supplied from the projection pattern memory controller 157 is initially a "1" level and since the READY signal is supplied to the AND gate 158 upon receipt of a clock signal, the AND gate 158 is enabled, thus generating an output signal. The output signal of the AND gate 158, i.e. the clock signal, is supplied via delay circuit 159 to the memory address counter 152. The memory address counter 152 is incremented every time it receives a clock signal from the AND gate 158. The output signal of the AND gate 158 is at the same time supplied to the READ terminal of the projection pattern memory controller 157, and the the count of the memory address counter 152 is read into the projection pattern memory controller 157. When the output of the AND gate 158, i.e. a clock signal, is supplied to the READ terminal, the projection pattern memory controller 157 receives the count of the memory address counter 152 and then reads the data from that address of the projection pattern memory 46 designated by the count of the memory address counter 152. The data read from the projection pattern memory 46 is stored in data register 160 through the projection pattern memory controller.

The circuit of FIG. 16 further comprises comparator 161 connected to the data register 160 and receives the data therefrom. The comparator 161 continuously compares the data stored in the data register 160 with the data initially stored in the slice level counter 154 until the data stored in the data register 160 is larger than the data stored in slice level counter 154. That is, data is sequentially read out of the projection pattern memory 46 in accordance with the addresses sequentially designated by the memory address counter 152. When the data stored in the register 160 is larger than the data initially stored in the slice level counter 154, the contents of the memory address counter 152 is supplied to the rise-up register 162 under the control of the comparator 161. Once the contents of the counter 152 have been stored in the rise-up register 162, the flip-flop 163 generates a "1" level signal.

The memory address counter 152 is incremented as clock signals are supplied to the AND circuit 158. Thus, data is read from the data register 160 until the comparator 161 detects that the contents of the data register 160 is smaller than the contents of the slice level counter 154. When the contents of the data register 160 is smaller than the contents of the slice level counter 154, the comparator 161 supplies the fall-down address register 164 with a signal through OR 168 and AND gate 169. This signal instructs the fall-down address register 164 to store the contents of the memory address counter 152. Once the contents of the memory address counter 152 is stored in the fall-down address register 164, arithmetic operation circuit 165 calculates $(C+D)/2$, where C is the contents of the fall-down address register 164 and D is the contents of the rise-up address register 162.

The circuit of FIG. 16 further comprises a subtraction circuit 166 and a comparator 170. The subtractor circuit 166 calculates the difference between data C (i.e. the contents of the fall-down address register 164) and data D (i.e. the contents of the rise-up address register 162); that is, $E=C-D$. The comparator 170 compares data E with the data F stored in the pad size register 155 and representing the size of a pad. If E is larger than F, AND gate 171 generates an output signal, which sets a flip-flop 172, and the output of the arithmetic operation circuit 165, i.e. $(C+D)/2$, is stored in the central address register of the data register 151, the flip-flop 163 is reset, heading address data is supplied to the memory address counter 152 via an OR gate 173, and the slice level counter 154 is incremented. This sequence of operations is repeated until E is smaller than F.

When E is smaller than F, an END signal is applied to the register 156 through AND gate 167. The END signal terminates the detection of the middle point. The middle point address register 162 contains the data supplied to it just before E became larger than F.

The circuit of FIG. 16 is further provided with another comparator 174 to continuously compare the data stored in the memory last address register 153 and the count of the memory address counter 152. When the count of the memory address counter 152 is greater than the data stored in the memory last address register 153, the comparator 174 delivers an error signal through delay circuit 175 and an AND gate 176.

Figure 17A:
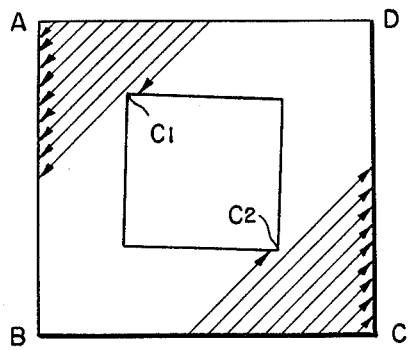
FIGS. 17A and 17B, FIGS. 18A and 18B and FIG. 19 illustrate the process of detecting the position of an IC chip in accordance with a second embodiment of the present invention.
Figure 17B:
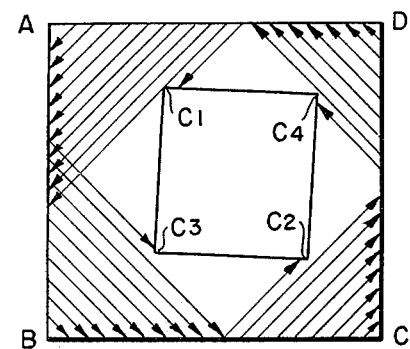
Figure 18A:
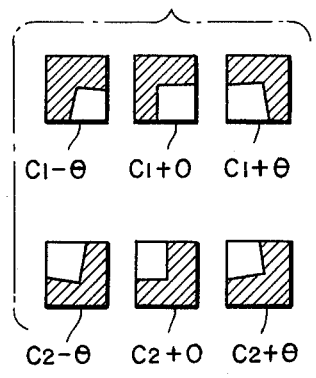
Figure 18B:
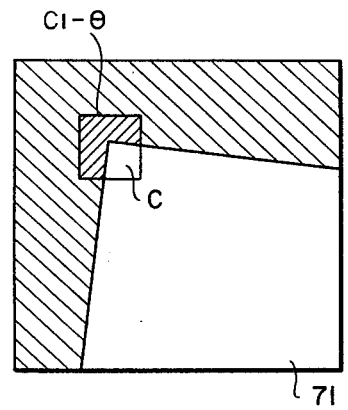
Figure 19:
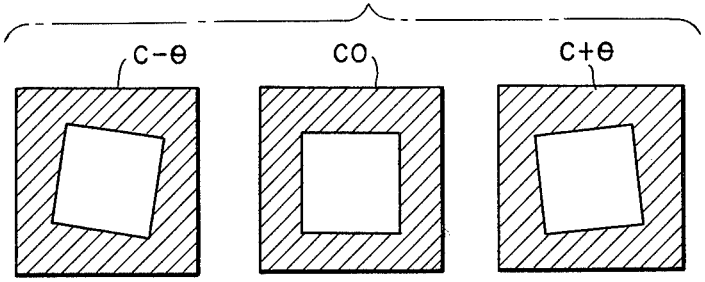

To detect the position of the IC chip image 71, various apparatus other than the above-described ones may be used according to this invention. For example, a rectangle circumscribed by the IC chip image 71 may be used to detect the position of the chip image 71, as disclosed Japanese Patent Application No. 55-28597 filed by the inventors hereof. Further, as shown in FIG. 17A, an image area ABCD may be scanned slantwise, beginning at the upper-left corner A and lower-right corner C of the area ABCD. The scanning is continued until the corners $C_1$ and $C_2$ of the IC chip image 72 are detected. Still further, as illustrated in FIG. 17B, an image area ABCD may be scanned slantwise, beginning at the four corners A, B, C and D, and the scanning is continued until the corners $C_1$, $C_2$, $C_3$ and $C_4$ of the IC chip image 72 are detected. Furthermore, use may be made of such templet data $C_{1-\theta}$, $C_{1+0}$, $C_{1+\theta}$ and $C_{2-\theta}$, $C_{2+\theta}$, $C_{2-\theta}$ as shown in FIG. 18A, a memory storing a chip image data image 71 as shown in FIG. 18B is scanned, and the templet data $C_{1-\theta}$, for example is subjected to pattern matching with the desired corner $C_1$ of the chip image thereby to detect a corner of the IC chip image 71. Still further, use may be made of such templet data $C-\theta$, $C_0$ and $C+\theta$ as shown in FIG. 19. These templets surround the four sides of the chip image, and define chip images inclined at angles $-\theta$, 0° and $+\theta$, respectively. These templet data are subjected to pattern matching with the chip image, thereby to detect the position of the IC chip image 71 The methods using such templet data as shown in FIGS. 18A and 19 require a pattern matching circuit.

Figure 20:
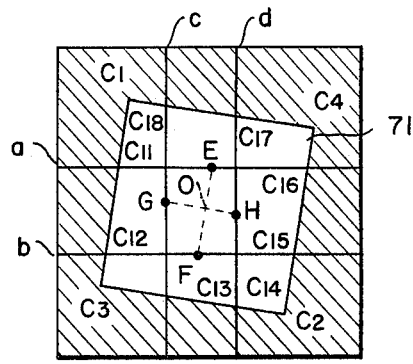
FIG. 20 illustrates the process of detecting the position and inclination of the chip in accordance with a third embodiment of the present invention.

To detect both the position and inclination of the IC chip image 71, such method as illustrated in FIG. 20 may be employed. That is, a chip image 71 is scanned along two parallel lines (a) and (b) and then along two parallel lines (c) and (d). Then, addresses $C_{11}$ to $C_{18}$ of points where the four sides of the image 71 intersect with the lines (a), (b), (c) and (d) are detected. The middle points E, F, G and H of $\overline{C_{11}C_{16}}$, $\overline{C_{12}C_{15}}$, $\overline{C_{13}C_{18}}$ and $\overline{C_{14}C_{17}}$ are calculated. From the addresses of the middle points E, F, G and H the address of center 0 of the chip image 71 is obtained. Further, the inclination of the image 71 is calculated, and the addresses of corners $C_1$, $C_2$, $C_3$ and $C_4$ of the chip image 71 are detected.

The inclination of the chip image 71 may be detected by another method. For instance, either the method shown in FIG. 10 of Japanese patent application No. 55-28597 or the method shown in FIG. 11 of the application may be employed.

If the above-described methods are employed to identify a pad pattern, the profile of the IC chip need not be detected with such precision as is required to determine the correct center of the pad pattern. Thus, the data for detecting the profile of the IC chip may be larger than the data used for identifying a pad pattern. If different amounts of data are required, the resolutions of the chip image and pad pattern image are different, and the efficiency of pattern identification will be enhanced.

In the above-described embodiments, use is made of only one view window. Instead, the position and size of another smaller view window may be determined in the same way as mentioned above. Of course, a third smaller view window may be used, its position and size being determined in the same way.

As mentioned above, according to the above embodiment, the profile of an object is first detected through simple data processing, the size and position of a view window are then determined, the position of a view window is corrected if necessary so that a pattern on the object may be viewed in the view window. Once the pattern is within the view window, its position can be detected by processing a small amount of data. If follows that the pattern can be identified at a higher speed and extraneous patterns near the desired pattern, if any, are not identified. Thus, the method of this invention can identify a pattern both quickly and accurately.

The above explanation relates to an embodiment in which a single optical lens is used. Another embodiment of the present invention is described below, in which two optical lens systems are used.

Figure 21:
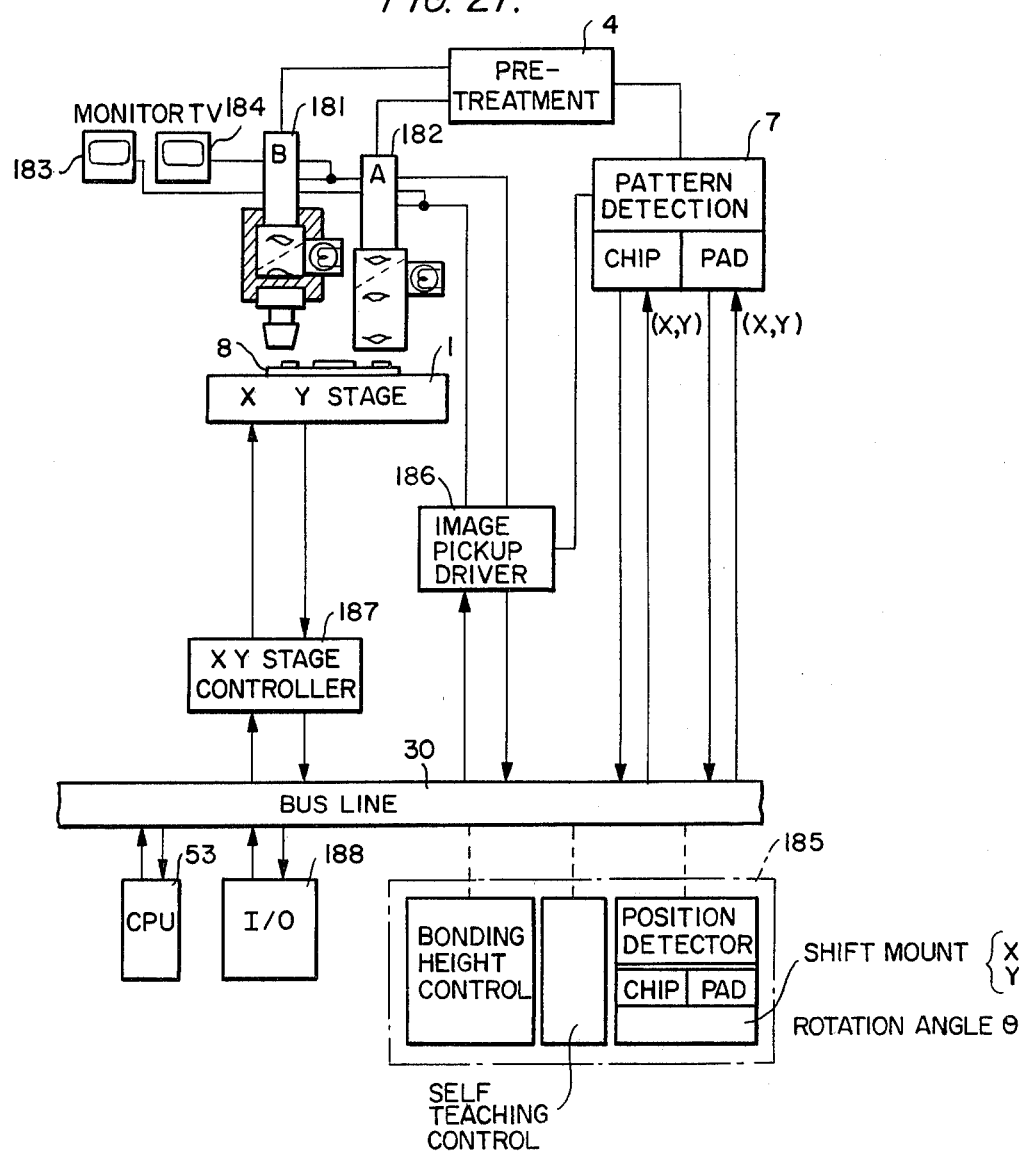
FIG. 21 is a block diagram illustrating a fourth embodiment of the present invention.

As shown in FIG. 21, a hybrid IC having one IC chip pellet 8 is placed on an XY stage 1. The IC chip pellet 8 has an IC chip pattern 71 and a first IC pad pattern 9 as shown in FIG. 22B. The IC chip pattern 71 comprises a second IC pad pattern 180, as illustrated in FIG. 22B. The IC chip pattern 71 is photographed by two optical systems provided parallel to each other, i.e. the B optical system 181 and the A optical system 182 (FIG. 21). The B optical system 181 views within its view field the IC chip pellet 8 having the IC chip pattern 71 and receives the image data of the IC chip pattern 71. The A optical system 182 views within its view field only the second IC pad pattern 180 and receives the image data of the IC pad pattern 180. The optical systems 181 and 182 cooperate to detect the positions of bonding pads.

Suppose the maximum size of the IC chip, the position of which is detected by the B optical system 181, is 2 mm×2 mm, and that the IC chip may be displaced ±0.2 mm from a prescribed position on the XY stage 1 (FIG. 21). Then, the B optical system 181 and the A optical system 182 have view field sizes and image resolutions as shown in Table 1.

TABLE 1

|  | View field | Resolution | Remarks |
| --- | --- | --- | --- |
| B Optical System | 2.56 mm × 2.56 mm | 10 μm | Chip size: 2 mm × 2 mm |
| A Optical System | 0.256 mm × 0.256 mm | 1 μm | Chip positioning Accuracy: ±0.2 mm Pad size: 0.15 mm² Picture Element: 256 × 256 |

As Table 1 shows, the position of the IC chip pellet 8 can be detected to 10 μm by the B optical system 2. Since the displacement of the IC chip pattern 71 and the other pattern on the pellet 8 is limited to an accuracy of within ±20 μm, it is possible to estimate the position of the bonding pads laid on the IC chip pattern, with an accuracy of ±30 μm.

With this accuracy, when the second pad pattern 180 is aligned with the A optical system 182, the second pad pattern 180 is within the view field of 0.256 mm×0.256 mm, the positions of the individual bonding pads can be detected with resolution of 1 μm.

The output data of the optical systems 181 and 182 are displayed by monitor television sets 183 and 184. Simultaneously, they are supplied to a binary-coded signal processing circuit 4. Each output data is respectively converted into binary-coded signals in accordance with two slice levels. The binary-coded signals are supplied to the pattern detecting section 7 which generates data representing the position (i.e. X-Y coordinates) of the IC chip pellet 8 according to the data supplied from the B optical system 181. It also generates a data representing the position (i.e. X-Y coordinates) of a bonding pad according to the data supplied from the A optical system 182. The output data of the pattern detecting section 7 is supplied to the bus 30.

Also connected to the bus 30 is memory 185 storing a self-teaching algorithm and a position detecting algorithm. When the output data of the section 7 is supplied to the bus 30, the corresponding data is read from the memory 185 and supplied to the image pickup section driver 186 under the control of a program instruction supplied to the bus 30 from the central processing unit (CPU) 53. In response to the data read from the memory 185, the driver 186 drives both optical systems 181 and 182. In the meantime, an algorithm for sequence drive of the XY stage 1 is read out of the memory 185 and supplied to the XY stage controller 187. At the same time, a program instruction is supplied to the controller 187 from the CPU 53. According to the sequence drive algorithm and under the control of the program instruction, the XY stage controller 187 moves the XY stage 1, thereby aligning the IC chip pellet 8 with a wire bonding apparatus (not shown). Also connected to the bus 30 are various imput-output (I/O) devices 188. Through the bus 30 the I/O devices 188 can supply and receive various data.

The detailed circuit of the pattern detecting section 7 as well as the circuit in which the operation conducted by data stored in the memory 185 have already been explained above.

FIG. 22A is a flow chart illustrating how the image pickup section of the apparatus shown in FIG. 21 detects the position of a pattern. FIGS. 22B, 22C, 22D, and 22E show various images displayed by the monitor television sets 183 and 184.

The image pickup section detects the position of the pad pattern 180 in two steps, i.e. self-teaching step for manual rough alignment of the pad pattern and position detecting step for automatic fine alignment of the pad pattern.

In the first step, the IC chip pellet 8 shown in FIG. 22B is put on the XY stage 1. Then, the XY stage 1 is moved by hand so that the IC chip pattern 71 is within the view field of the B optical system 181. The IC chip pattern 71 or image B is displayed by the monitor television set 184. Seeing the image B, an operator places the IC chip pattern 71 at a reticle mark 189, as illustrated in FIG. 22B, by hand. This done, the A optical system 182 is operated, thereby displaying the IC pad pattern 180 or image A on the monitor television set 184. Seeing the image B thus displayed, the operator places by hand the reticle mark 189 at a desired position on the IC pad pattern, as illustrated in FIG. 22C. Thus, the detection windows of both optical systems 181 and 182 are set, these windows being displayed as bright portions on the monitor television sets 183 and 184.

The second step, i.e. automatic fine alignment of the pad pattern is then executed. First, another IC chip pellet is put on the XY stage 1, after removing the IC chip pellet 8 used above. The optical systems 181 and 182 are then operated to display the IC chip pattern and IC pad pattern of the new pellet on the monitor television sets 184 and 183, respectively. If the IC chip pattern is, in image B as shown in FIG. 22D, and the IC pad pattern is, in image A displaced as shown in FIG. 22E, the image pickup section driver 186 and the XY stage controller 187 are driven according to data showing the displacement of the pad pattern from the reticle 189 in terms of X-Y coordinates 190 and 191, whereby the bonding pads are positioned exactly in alignment with the wire bonding apparatus (not shown). Thereafter, the height of the bonding pads is detected. Finally, the automatic wire bonding apparatus is operated, thus conducting wire bonding on the IC chip pellet.

Figure 23:
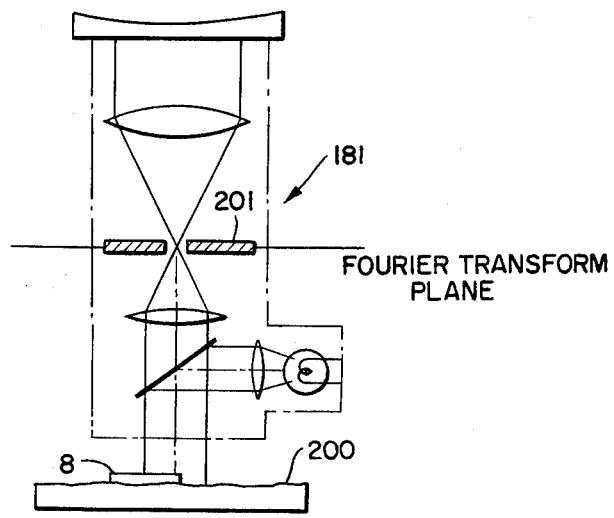
FIG. 23 illustrates an image pickup means used in the fourth embodiment shown in FIG. 21.

FIG. 23 shows another embodiment of the invention, which improves the optical S/N ratio of an image picked up by the B optical system. This apparatus is identical to that of FIG. 21, except that use is made of a substrate 200 having a rough surface and that the B optical system is provided with a filter for removing optically high spatial frequency components from incident light. The filter may be a low-pass filter which is usually employed, as disclosed in "Handbook of Optical Technology," Asakura Books Co., Japan, to lessen granularity of image. Alternatively, the filter may be a diaphragm 201 which is placed in the Fourier transform plane of the image as shown in FIG. 23 thereby to shield the high frequency components of incident light. As a result, the B optical system 181 generates image signals having a high S/N ratio.

Figure 24:
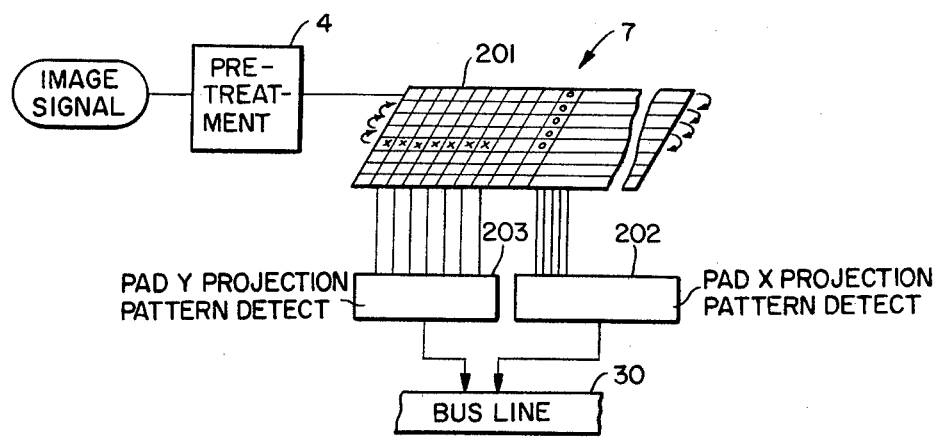
FIG. 24 illustrates a fifth embodiment of the present invention.

FIG. 24 shows still another embodiment of the invention, which improves the operation efficiency of such a pattern detecting section 7 as shown in FIG. 21. As shown in FIG. 24, image signals are converted by a pre-treatment circuit 4 into binary-coded signals. The binary-coded signals are supplied to a two-dimensional shift register 201. The memory bits of the register 201 are scanned in the X direction by the circuit 202 to detect the projection pattern in the X direction and in the Y direction by the circuit 203 to detect the projection pattern in the Y direction, whereby the four corners of each bonding pad 180 (FIG. 22B) may be detected. In practice, only two pads, one positioned at the upper-left corner of such an IC chip pattern 71 as shown in FIG. 22B and the other positioned at the lower-right corner of the IC chip pattern 71 are detected, thereby to determine the positions of all the bonding pads. This is an effective method for detecting a pad pattern.

FIGS. 25A and 25B, FIGS. 26A and 26B and FIGS. 27A and 27B show three other embodiments of the invention, wherein the two optical systems 181 and 182 shown in FIG. 21 are replaced by one image pickup device which sequentially senses an IC chip pattern and an IC pad pattern or which senses both an IC chip pattern and an IC pad pattern at the same time by either electrical or optical means, thus achieving the same effect as does the embodiment show in FIG. 22.

Figure 25A:
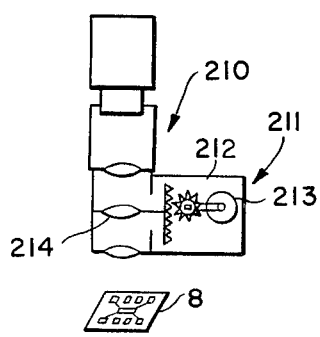
FIGS. 25A and 25B illustrates a sixth embodiment of the present invention.
Figure 25B:
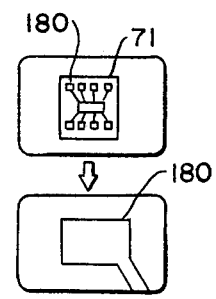

In the embodiment of FIGS. 25A and 25B, an image pickup device 210 is provided with an automatic zoom lens unit 211. The unit 211 comprises a gear mechanism 212, a motor 213 and a lens system 214. The motor 213 drives the gear mechanism 212, which in turn drives the lens system 214. The unit 211 is automatically operated so as to pick up such images as shown in FIG. 25B, which are similar to the images shown in FIGS. 22B and 22C or FIGS. 22D and 22E.

Figure 26A:
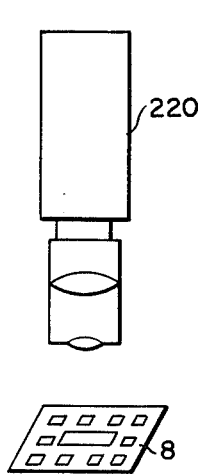
FIGS. 26A, 26B and 26C illustrate a seventh embodiment of the present invention.
Figure 26B:
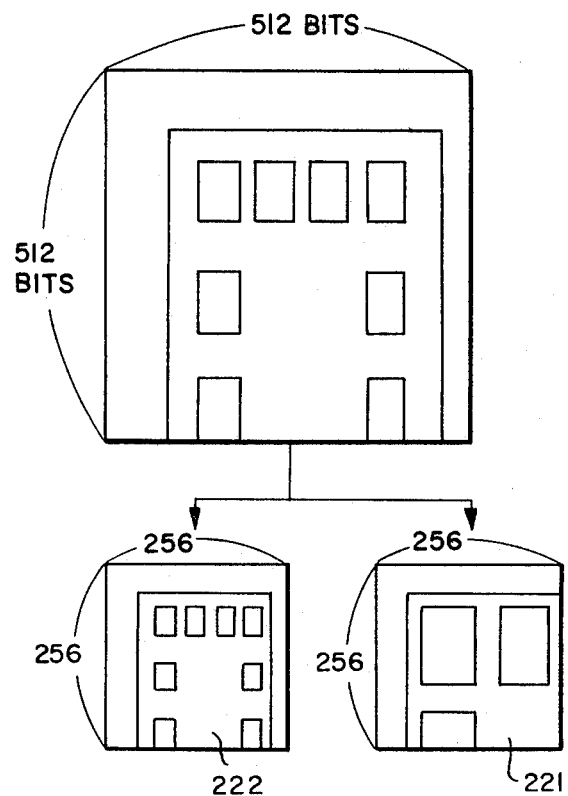
Figure 26C:
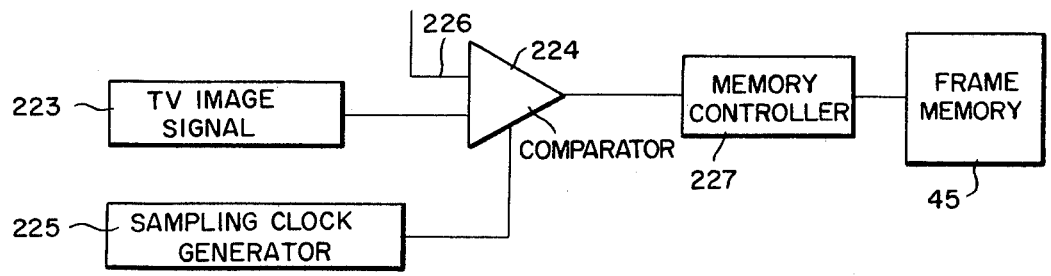

In the embodiment of FIGS. 26A and 26B, an image pickup device 220 is as designed to change magnifying power electrically. Thus, it is possible to display an image 221 resulting from a high magnifying power and an image 222 resulting from a low magnifying power, as illustrated in FIG. 26B. FIG. 26C is a circuit diagram for electrically obtaining highly magnified video image data and low magnification power using a single image pickup device. A T.V. image signal 223 or the output from the pickup device 220 is subject to a sampling operation at comparator 224 when a sampling clock is supplied to the comparator 224 from sampling clock generator 225. A slice level voltage is fed to input terminal 226 of the comparator 224. Sampling for low magnification power is conducted with a large sampling internal and a sampling for high magnifying power be performed a small sampling internal. In the embodiment show in FIGS. 26A and 26B, for example, the TV image signal is sampled at an interval of 10 $\mu$m, the low magnification power image 222 is sampled at an interval of 20 $\mu$m and the high magnification power image 221 is sampled at an interval of 10 $\mu$m. The output of the comparator 224 is stored in the frame memory through a memory controller 227.

Figure 27A:
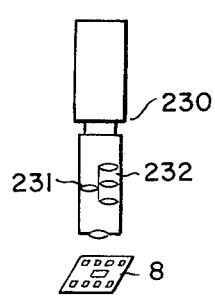
FIGS. 27A and 27B illustrate an eighth embodiment of the present invention.
Figure 27B:
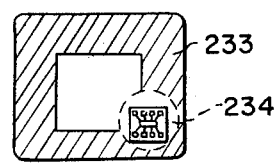

In the embodiment of FIGS. 27A and 27B, an image pickup device 230 is provided with two lens systems, i.e. lens system 231 and lens system 232. Thus, it is possible to display on the same display device high magnification image 233 and low magnification image 234, as illustrated in FIG. 27B.

As mentioned above, an apparatus according to the embodiment of this invention is provided with a first optical system for picking up the IC chip pattern of a hybrid IC or the like and a second optical system for picking up the pad pattern included in the IC chip pattern, uses a substrate having a rough surface on which an IC chip pellet is placed, and employs a diaphragm in the Fourier transform plane of the first optically system, thereby displaying clear images of both chip pattern and pad pattern and detecting the correct positions of individual bonding pads. Hence, the apparatus can facilitate flawless wire bonding between the first pad pattern on the IC chip pellet and the second pad pattern on the chip pattern.

It should be noted that one picture element may correspond to two bits of the frame memory to express both chip and pad image based on the two slice levels of the binary coded signal.

As is described above in detail, the present invention utilizes two slice levels when the image signal sensed by the image pickup device is converted into binary coded signals, in accordance with the first slice level corresponding to the chip pattern and the second slice level corresponding to the pad pattern. Thus, as both the chip and pad patterns are formed in the frame memory as a binary image, the position of a particular pad can be identified based of the corner address of the chip, with high accuracy and with high speed without processing the data defining the entire surface of the chip.

The foregoing detailed description is present as illustration and example. The spirit and scope of this invention should not be limited by the above description.

What is claimed is:

1. A method for recognizing a position of an object having an absolute position and orientation and having a surface and a pattern thereon, and for recognizing a desired portion of the pattern, said method comprising the steps of:
   (a) sensing an image within a predetermined area of the object and forming a first and a second resolution image signal corresponding to the object and pattern respectively;
   (b) detecting the position of the object in accordance with the first resolution image signal;
   (c) receiving data representing a positional relation between the object and the pattern;
   (d) determining a predetermined area of the object in accordance with the data representing the positional relation between the object and the pattern;
   (e) detecting the position of the desired portion of the pattern in accordance with the second resolution image signal within the predetermined area, wherein the first resolution is lower than the second resolution.

2. A method for recognizing and sensing an object having corners and a surface with a pattern formed thereon, said method comprising:
   (a) defining a field of view having a center line;
   (b) defining a view surface within the field of view and including the object;
   (c) providing image signals responsive to the object and the view surface;
   (d) converting the image signals into digital data in accordance with a first and a second conversion signal level;
   (e) storing the digital data in respective storage locations of a memory;
   (f) providing the digital data stored in the respective ones of the storage locations in a specified sequence;
   (g) detecting a first predetermined data of the digital data corresponding to a respective one of the corners of the object;
   (h) detecting a second predetermined data of digital data corresponding to the pattern;
   (i) generating a projection pattern corresponding to a predetermined portion of the digital data corresponding to the pattern;
   (j) detecting the storage locations storing the center signal of the projection pattern signals.

3. A recognition apparatus for sensing an object having a pattern thereon and for sensing a desired portion of the pattern, said apparatus being operatively connected to receive data representing a positional relation between the object and the pattern, the object having an absolute position and an orientation, and comprising:
   an image sensing section having outputs, for sensing an image of said pattern on said object and for generating, as outputs, image signals corresponding to said object, said pattern, and an area adjacent to said object;
   a pre-treatment circuit operatively connected to said image sensing section and to receive two slice levels, for converting the outputs of the image sensing section into a first binary-coded signal corresponding to the object, accordance with a first slice level, and for converting the outputs of the image sensing section into a second binary-coded signal corresponding to the pattern, in accordance with a second slice level;
   a pattern detecting section operatively connected to said pre-treatment circuit, for detecting the absolute position and orientation of the object in accordance with said first binary-coded signal, for determining a predetermined area of the object in accordance with the data representing the positional relation between the object and the pattern, and for detecting the desired portion of the pattern within said predetermined area in accordance with said second binary-coded signal.

4. An apparatus according to claim 1, wherein said object has corners and said pattern detecting section comprises means for scanning said binary-coded signals in a slantwise manner to detect a binary-coded signal corresponding to one corner of the object, thereby detecting the position of one of said corners of the object, and wherein said predetermined area of the object is further determined in accordance with the binary-coded signal corresponding to said one of said corners.

5. An apparatus according to claim 4, wherein said pattern detecting section further comprises means for scanning said binary-coded signals corresponding to the sensed image of the object along a vertical line passing a point at a predetermined distance from the location of said one of said corners of the object and along a horizontal line passing a point at a predetermined distance from the location of the one of said corners of the object, thereby detecting the orientation of the object.

6. An apparatus according to claim 1, wherein said object has corners and said pattern detecting section comprises means for scanning, in a grid like manner, said binary-coded signals along two parallel lines and along another two prallel lines which intersect with said two parallel lines at right angles to detect a binary-coded signal corresponding to one corner of the object, and wherein said predetermined area of the object is further determined in accordance with the binary-coded signal corresponding to said one of said corners.

7. An apparatus according to claim 1, wherein said patterning detecting section comprises means for scanning said binary-coded signals corresponding to the sensed image of the pattern along an x-axis and y-axis to generate x-axis projection data and y-axis projection data, each of said x-axis and y-axis projection data comprises rows of bits each having a length in accordance with a corresponding portion of said pattern, and wherein said pattern detecting section further comprises means for scanning said rows of bits for a row having a length equal to a predetermined width of the pattern, and for detecting the middle point of the row of the pattern, whereby the width of the pattern and the center of the pattern are detected.

8. An apparatus according to claim 1, wherein the first binary-coded signal has a lower frequency than the second binary-coded signal.

9. A recognition apparatus for sensing an object having a pattern thereon and for sensing a desired portion of the pattern, comprising an image sensing section having outputs, for sensing an image of said pattern on said object and for generating, as outputs, image signals corresponding to said object, said pattern, and an area adjacent to said object;
   a pre-treatment circuit operatively connected to said image sensing section and to receive at least two slice levels, for converting the outputs of the image sensing section into binary-coded signals; and
   a pattern detecting section operatively connected to said pre-treatment circuit, for detecting the position of the pattern in accordance with the binary-coded signals generated by the pre-treatment circuit, said image sensing section comprises a first optical system for sensing an image of the object and a second optical system for sensing an image of the pattern.

10. An apparatus according to claim 9, wherein said image sensing section comprises a first optical system providing output data, for sensing a image of the object, and a second optical system providing output data, for sensing an image of the pattern.

11. An apparatus according to claim 10, wherein said object comprises a semiconductor device including a substrate having a rough surface, and said first optical system comprises a diaphragm.

12. An apparatus according to claim 10, wherein said object comprises a semiconductor device, having a wiring pattern, and said second optical system senses the wiring pattern, and the position of the wiring pattern is detected by said pattern detecting section, in accordance with the output data provided by said first optical system and corresponding to the position of the device.

13. An apparatus according to claim 10, further comprising a two-dimensional memory device operatively connected to said pre-treatment circuit, wherein said object comprises a semiconductor device having a wiring pattern, said second optical system generates image signals corresponding to the wiring pattern, said pretreatment circuit stores said image signals in said two-dimensional memory device, and wherein the pattern detection section comprises means for scanning said image signals stored in the two-dimensional memory device along an X and Y direction, and for detecting the edges of the wiring pattern and the position of the wiring pattern.

14. An apparatus according to claim 10, wherein said first and second optical systems comprise a single image sensing device having magnification powers, and which senses two images of said object in accordance with respective ones of said magnification powers.

15. An apparatus according to claim 10, wherein said first and second optical systems comprise a single image sensing device having electrically selectable magnification powers, and which senses two images of said object in accordance with respective ones of said electrically selectable magnification powers.

16. An apparatus according to claim 10, wherein said first and second optical systems comprise a single image sensing device having a plurality of optical magnifying powers, and which optically senses a plurality of images in accordance with respective ones of said optical magnifying powers.

17. A recognition apparatus for sensing an object and a pattern thereon, the object having corners and a surface, said apparatus comprising:

an image sensing means having a field of view with a center line, for sensing a view surface defined by said field of view and including said object, and for providing image signals in accordance with said object and said view surface;

A/D conversion means, operatively connected to said image sensing means, for converting said image signals into digital data in accordance with a first and a second conversion signal level and for providing said digital data as an output;

a bus line;

memory means having a specified number of storage locations, operatively connected to said A/D conversion means and to said bus line, for storing said digital data in respective ones of said storage locations;

reading means, operatively connected to said bus line and to receive memory address signals, for accessing respective ones of said storage locations in accordance with said memory address signals, and for providing said digital data stored in said respective ones of said storage locations as an output;

corner detecting means, operatively connected to said bus line, for accessing respective ones of said storage locations in accordance with a specified sequence, for detecting a first predetermined data of said digital data, corresponding to respective ones of said corners, and for providing a corner detect signal indicating said respective one of said storage locations storing digital data corresponding to said first predetermined data;

image correcting means, operatively connected to said bus line for accessing respective ones of said storage locations, for detecting a second predetermined data of said digital data corresponding to said pattern, and for providing a correction signal indicating said respective one of said storage locations storing said second predetermined data;

projection pattern generating means, operatively connected to said bus line, for accessing respective ones of said storage locations, for generating projection pattern signals corresponding to a predetermined portion of said digital data corresponding to said pattern, and for storing said projection pattern signals in respective storage locations of said memory means;

center point detection means, operatively connected to said bus line, for accessing said projection pattern signals and for generating a center point signal indicating the storage location storing the center signal of said projection pattern signal;

control means, operatively connected to said bus line, for providing address signals and control signals, and for storing said digital data into said memory means.

18. A recognition apparatus according to claim 17, wherein said reading means comprises:

first means operatively connected to said control means for receiving said address signals and one of said control signals;

second means operatively connected to said first means, for providing a first portion of said address signals to said memory means;

gate means, operatively connected to receive a second part of said address signals, for receiving digital data specified by said first part of said address signals and for providing as said output, a portion of said received digital data specified by said second portion of said address signals.

19. A recognition apparatus according to claim 17, wherein said corner detecting means comprises:

first means, operatively connected to said bus line for receiving and storing a first portion of said address signals and a first portion of said control signals;

decoding means, operatively connected to said first means, for initiating said specified sequence in accordance with said first portion of said address signals;

memory address generating means, operatively connected to said decoding means and to said bus line, for providing said memory address signals corresponding to respective ones of said storage locations for storing digital data corresponding to adjacent portions of said view surface along a diagonal line with respect to said center line, and for providing said corner detect signal.

20. A recognition apparatus according to claim 19, wherein said address signals comprise X scanning signals and Y scanning signals, and wherein said memory address gating means comprises:

x scanning signal control means operatively connected to said first means and to said decoding means, for providing a start control signal responsive to said first portion of said control signals and a x scanning control signal indicating respective ones of said adjacent portions of said view surface along a line parallel to said center line;

y scanning signal control means, operatively connected to said first means, to said x scanning signal control means and to said decoding means, for providing an end control signal corresponding to one of said first portion of said control signals being responsive to said first predetermined data corresponding to a respective one of said corners, and for providing a y scanning control signal indicating respective ones of said adjacent portions of said view surface along a line perpendicular to said center line;

x scanning signals and y scanning signals generating means, operatively connected to said first means, to said decoding means, to said x scanning signal control means, and to said y scanning signal control means for providing x scanning signals indicating respective ones of said adjacent portions of said view surface along a diagonal line with respect to said center line in accordance with said x scanning signal and in response to said start control signal, and for providing y scanning signals indicating respective ones of said adjacent portions of said view surface along a diagonal line with respect to said center line in accordance with said x scanning control signal.

21. A recognition apparatus according to claim 17, wherein said address signals comprise x scanning signals and y scanning signals and wherein said image correcting means comprises:

first means, operatively connected to said bus line, for receiving and storing respective ones of said x scanning signals and said y scanning signals, and for receiving a first portion of said control signal;

memory control means, operatively connected to said bus line and to said first means, for accessing said respective ones of said storage locations in response to one of said first portion of said control signals and in accordance with said x scanning signals and y scanning signals, and for providing said digital data stored in said respective ones of said storage locations;

memory address signals generating means, operatively connected between said first means and said memory control means, for providing said memory address signals being responsive to said x scanning signals and said y scanning signals and a second one of said first portion of said control signals, to said memory control means;

correction signal generating means, operatively connected to said first means and to said memory address signal generating means, for providing said correction signal being responsive to said x scanning signals, said y scanning signals and said memory address signal;

digital data checking means, operatively connected between said memory control means and said first means, for providing a third one of said first portion of said control signals in rsponse to detecting said predetermined digital data corresponding to said pattern, and for storing said correction signal in said first means in response to said third one of said first portion of said control signals.

22. A recognition apparatus according to claim 17, wherein said address signals comprise x signals and y signals and said projection pattern generating means comprises: first means, operatively connected to said bus line, for receiving and storing respective ones of said x scanning signals and said y scanning signals, and for receiving a first portion of said control signals;

first memory control means, operatively connected to said bus line and to said first means, for accessing said respective ones of said storage locations in response to one of said first portion of said control signals and in accordance with said x scanning signals and said y scanning signals, and for providing said digital data stored in said respective ones of said storage locations;

projection pattern signals generating means, operatively connected between said first means and said first memory control means, to receive said x signals and said y signals and to receive a first two of said first portion of said control signals, for generating said projection pattern signals in response to said respective ones of said x signals and said y signals corresponding to respective ones of said storage locations for storing said digital data corresponding to said pattern;

digital data checking means, operatively connected to receive said digital data from said first memory control means, for providing a clock signal responsive to said predetermined portion of said digital data corresponding to said pattern;

second memory control means, operatively connected between said bus line and said projection pattern signals generating means, to receive one of said first two of said first portion of said control signals and said clock signal, for storing in response to said clock signal, said projection pattern signals in respective ones of said storage locations.

23. A recognition apparatus according to claim 17, wherein said address signals include x signals and y signals and said control signals include slice signals indicating adjacent points respectively parallel to and perpendicular to said center line an wherein said center point detecting means comprises:

bus interface means, operatively connected to said bus line, for receiving and storing respective ones of said x signals and said y signals, and for receiving a first portion of said control signals;

first memory control means, operatively connected to receive a first one of said first portion of said control signals, for accessing said respective storage locations storing said projection pattern signals and for providing a first control signal; projection pattern signal address generating means, operatively connected between said bus interface means and said first memory control means, for generating said respective ones of said address signals corresponding to said respective storage locations storing said projection pattern signals corresponding to adjacent portions of said pattern, in accordance with a first two of said first portion of said control signals and said x signals and said y signals, and in accordance with said slice signals;

centerpoint signal generating means, operatively connected to said projection pattern signal address generating means and to said bus line interface means, for calculating the address signal corresponding to the address of the respective one of said storage locations storing the center one of said projection pattern signals.

* * * * *

UNITED STATES PATENT AND TRADEMARK OFFICE
CERTIFICATE OF CORRECTION

PATENT NO. : 4,450,579  
DATED : May 22, 1984  
INVENTOR(S) : NAKASHIMA ET AL.

It is certified that error appears in the above-identified patent and that said Letters Patent is hereby corrected as shown below:

Front Page, [57] Line I, after "sensor" insert --for--;

Column 3, line 65, "illustrates" should be --illustrate--.  
Column 4, line 3, "illustrates" should be --illustrate--.  
Column 7, line 48, after "8B" insert --the--; delete "the".  
Column 8, line 17, after "address" insert --X register--.  
Column 9, line 23, "$1x_1$" should be --$\ell x_1$--.

line 27, "$1y_1$" should be --$\ell y_1$--;

line 46, delete "position" (second occurrence)  
Column 10, line 66, "$1_1$" should be --$\ell_1$--; "$1_2$" should be --$\ell_2$--;

line 68, "lo" should be --$\ell$o--.  
Column 11, line 5, "lo" should be --$\ell$o--;  
        line 6, "lo" should be --$\ell$o--;  
        line 9, "lo" should be --$\ell$o--;  
        line 11, "lo" should be --$\ell$o--;  
        line 28, "lo" should be --$\ell$o--;  
        line 30, "lo" should be --$\ell$o--.  
Column 12, line 1, delete "supplied";  
        line 19, "signakl" should be --signal--;  
        line 38, delete "to";  
        line 40, delete "to".

UNITED STATES PATENT AND TRADEMARK OFFICE
CERTIFICATE OF CORRECTION

PATENT NO. : 4,450,579

DATED : May 22, 1984

INVENTOR(S) : NAKASHIMA ET AL.

It is certified that error appears in the above-identified patent and that said Letters Patent is hereby corrected as shown below:

```
Column 14, line 57, "patent application" should be
          --Patent Application--.
Column 18, line 8, delete "as";
          line 22, "nal" should be --val--;
          "be" should be --is--;
          line 23, "internal" should be --interval--;
          line 66, "present" should be --presented--.

Column 20, line 11, "claim 1" should be --claim 3--;
          line 29, "claim 1" should be --claim 3--;
          line 39, "claim 1" should be --claim 3--;
          line 53, "claim 1" should be --claim 3--.
Column 21, line 31, "pretreatment" should be --pre-treatment--.
Column 24, line 10, "rsponse" should be --response--;
          line 56, "an" should be --and--.
```

Signed and Sealed this

Twelfth Day of February 1985

[SEAL]

*Attest:*

DONALD J. QUIGG

*Attesting Officer*  *Acting Commissioner of Patents and Trademarks*